(12) United States Patent
Soejima

(10) Patent No.: US 11,112,247 B2
(45) Date of Patent: Sep. 7, 2021

(54) ANGULAR VELOCITY SENSOR, SENSOR ELEMENT, AND MULTI-AXIS ANGULAR VELOCITY SENSOR

(71) Applicant: KYOCERA Corporation, Kyoto (JP)

(72) Inventor: Munetaka Soejima, Soraku-gun (JP)

(73) Assignee: KYOCERA CORPORATION, Kyoto (JP)

( * ) Notice: Subject to any disclaimer, the term of this patent is extended or adjusted under 35 U.S.C. 154(b) by 312 days.

(21) Appl. No.: 16/320,085

(22) PCT Filed: Jul. 21, 2017

(86) PCT No.: PCT/JP2017/026392
§ 371 (c)(1),
(2) Date: Jan. 23, 2019

(87) PCT Pub. No.: WO2018/021167
PCT Pub. Date: Feb. 1, 2018

(65) Prior Publication Data
US 2019/0271544 A1 Sep. 5, 2019

(30) Foreign Application Priority Data

Jul. 26, 2016 (JP) .............................. JP2016-146350

(51) Int. Cl.
*G01C 19/5642* (2012.01)
*G01C 19/5747* (2012.01)
(Continued)

(52) U.S. Cl.
CPC .......... *G01C 19/574* (2013.01); *H01L 41/047* (2013.01); *H01L 41/113* (2013.01);
(Continued)

(58) Field of Classification Search
CPC ............ G01C 19/5607; G01C 19/5614; G01C 19/5621; G01C 19/5628; G01C 19/5642;
(Continued)

(56) References Cited

U.S. PATENT DOCUMENTS

| 6,520,015 B1 | 2/2003 | Alause et al. |
| 2001/0001928 A1* | 5/2001 | Kikuchi ............. G01C 19/5642 73/504.12 |

(Continued)

FOREIGN PATENT DOCUMENTS

| JP | 2003-510592 A | 3/2003 |
| JP | 2011-043399 A | 3/2011 |

(Continued)

*Primary Examiner* — Herbert K Roberts
(74) *Attorney, Agent, or Firm* — Volpe Koenig

(57) ABSTRACT

An angular velocity sensor includes a piezoelectric body, a drive circuit, and a detection circuit. The piezoelectric body includes a pair of frames, a pair of drive arms, and a pair of detection arms. The pair of frames face each other in a y-axis direction in an orthogonal coordinate system xyz. The pair of drive arms are respectively laid bridging the pair of frames and face each other in an x-axis direction. The pair of detection arms extend from the pair of frames in the y-axis direction at positions between the pair of drive arms in the x-axis direction. The drive circuit applies voltages of mutually reverse phases to the pair of drive arms so that the drive arms vibrate bending to mutually reverse sides in the x-axis direction. The detection circuit detects signals generated due to the bending deformations of the pair of detection arms in a z-axis direction.

9 Claims, 10 Drawing Sheets

(51) Int. Cl.
  *G01C 19/574* (2012.01)
  *H01L 41/047* (2006.01)
  *H01L 41/113* (2006.01)

(52) U.S. Cl.
  CPC ...... *H01L 41/1132* (2013.01); *G01C 19/5642* (2013.01); *G01C 19/5747* (2013.01)

(58) Field of Classification Search
  CPC ............ G01C 19/5649; G01C 19/5656; G01C 19/5663; G01C 19/574
  See application file for complete search history.

(56) References Cited

U.S. PATENT DOCUMENTS

| | | | |
|---|---|---|---|
| 2013/0277775 A1* | 10/2013 | Roland | G01C 19/5747 257/415 |
| 2016/0126924 A1* | 5/2016 | Nakagawa | H03B 5/30 331/156 |
| 2017/0052027 A1* | 2/2017 | Jomori | B81B 3/0021 |

FOREIGN PATENT DOCUMENTS

| | | |
|---|---|---|
| JP | 2015-087263 A | 5/2015 |
| JP | 2016-133427 A | 7/2016 |
| WO | 01/23838 A1 | 4/2001 |

\* cited by examiner

ANGULAR VELOCITY SENSOR, SENSOR ELEMENT, AND MULTI-AXIS ANGULAR VELOCITY SENSOR

TECHNICAL FIELD

The present disclosure relates to an angular velocity sensor, a sensor element used in the angular velocity sensor, and a multi-axis angular velocity sensor including the angular velocity sensor.

BACKGROUND ART

As an angular velocity sensor, a so-called "piezoelectric vibration type" one is known (for example, Patent Literature 1). In this sensor, an AC voltage is applied to a piezoelectric body to excite the piezoelectric body. When this excited piezoelectric body is rotated, a Coriolis force is generated with a magnitude corresponding to the rotational speed (angular velocity) in a direction perpendicular to the excitation direction. The piezoelectric body vibrates due to this Coriolis force as well. Further, by detecting an electrical signal generated in accordance with deformation of the piezoelectric body caused by this Coriolis force, the angular velocity of the piezoelectric body can be detected.

CITATION LIST

Patent Literature

Patent Literature 1: Japanese Patent Publication (Translation of PCT Application) No. 2003-510592A

SUMMARY OF INVENTION

An angular velocity sensor according to one aspect of the present disclosure includes a piezoelectric body, a drive circuit, and a detection circuit. The piezoelectric body includes a pair of frames, a pair of drive arms, and a pair of first detection arms. The pair of frames face each other in a y-axis direction in an orthogonal coordinate system xyz. The pair of drive arms are respectively laid bridging the pair of frames and face each other in an x-axis direction. The pair of first detection arms extend from the pair of frames in the y-axis direction at positions between the pair of drive arms in the x-axis direction. The drive circuit applies voltages of mutually reverse phases to the pair of drive arms so that the pair of drive arms vibrate bending to mutually reverse sides in the x-axis direction. The detection circuit detects signals generated due to the bending deformations of the pair of first detection arms in a z-axis direction or the x-axis direction.

A sensor element according to one aspect of the present disclosure includes a piezoelectric body, a plurality of excitation electrodes, a plurality of detection electrodes, and a plurality of wirings. The piezoelectric body includes a pair of frames, a pair of drive arms, and a pair of first detection arms. The pair of frames face each other in a y-axis direction in an orthogonal coordinate system xyz. The pair of drive arms are respectively laid bridging the pair of frames and face each other in an x-axis direction. The pair of first detection arms extend from the pair of frames in the y-axis direction at positions between the pair of drive arms in the x-axis direction. The plurality of excitation electrodes are located in an arrangement capable of applying voltages exciting the pair of drive arms in the x-axis direction. The plurality of detection electrodes are located in an arrangement capable of detecting signals generated due to vibration of the pair of first detection arms in a z-axis direction or the x-axis direction. The plurality of wirings connect the plurality of excitation electrodes so that voltages of mutually reverse phases are applied from the plurality of excitation electrodes to the pair of drive arms so that the pair of drive arms vibrate bending to mutually reverse sides in the x-axis direction.

A multi-axis angular velocity sensor according to one aspect of the present disclosure includes an x-axis sensor which detects an angular velocity around an x-axis in an orthogonal coordinate system xyz, a y-axis sensor which detects an angular velocity around a y-axis, and a z-axis sensor which detects an angular velocity around a z-axis. The x-axis sensor is the angular velocity sensor according to one aspect explained above. The y-axis sensor includes a piezoelectric body, a y-axis drive circuit, and a y-axis detection circuit. The piezoelectric body in the y-axis sensor includes a y-axis drive arm and a y-axis detection arm extending in the y-axis direction. The y-axis drive circuit applies voltages to the y-axis drive arm so that the y-axis drive arm vibrates in the x-axis direction. The y-axis detection arm detects signals generated due to bending deformation in the z-axis direction of the detection arm. The z-axis sensor is the angular velocity sensor according to one aspect explained above.

DESCRIPTION OF EMBODIMENTS

Below, embodiments according to the present disclosure will be explained with reference to the drawings. Note that, the following drawings are schematic ones. Accordingly, details will be sometimes omitted. Further, size ratios etc. do not always coincide with actual ones. Further, size ratios etc. between two or more drawings do not always coincide with each other either.

Further, at each drawing, for convenience of explanation, an orthogonal coordinate system xyz is attached. Note that, the orthogonal coordinate system xyz is defined based on the shape of the sensor element (piezoelectric body). That is, the x-axis, y-axis, and z-axis do not always indicate an electrical axis, mechanical axis, and optical axis of a quartz crystal. In the sensor element, any direction may be used as the "above" or "below". In the following description, however, for convenience, the "upper surface" or "lower surface" and other terms will be sometimes used where the positive side of the z-axis direction is the upper part. Further, when simply referring to "viewed on a plane", unless it is particularly explained, it means "viewed in the z-axis direction".

For the same or similar configurations, sometimes different letters of the alphabet will be attached such as the "drive arm 7A" and "drive arm 7B". Further, sometimes, the arms will be simply referred to as the "drive arms 7" and will not be differentiated.

In the second and following embodiments, for the configurations which are common with or similar to the configurations in the already explained embodiments, sometimes use will be made of the notations attached to the configurations in the already explained embodiments. Further, sometimes illustrations and explanations will be omitted. Note that, the configurations corresponding to (resembling) the configurations in the already explained embodiments are the same as the configurations in the already explained embodiments unless particularly explained even in a case where notations different from those of the configurations in the already explained embodiments are attached.

First Embodiment

Figure 1:
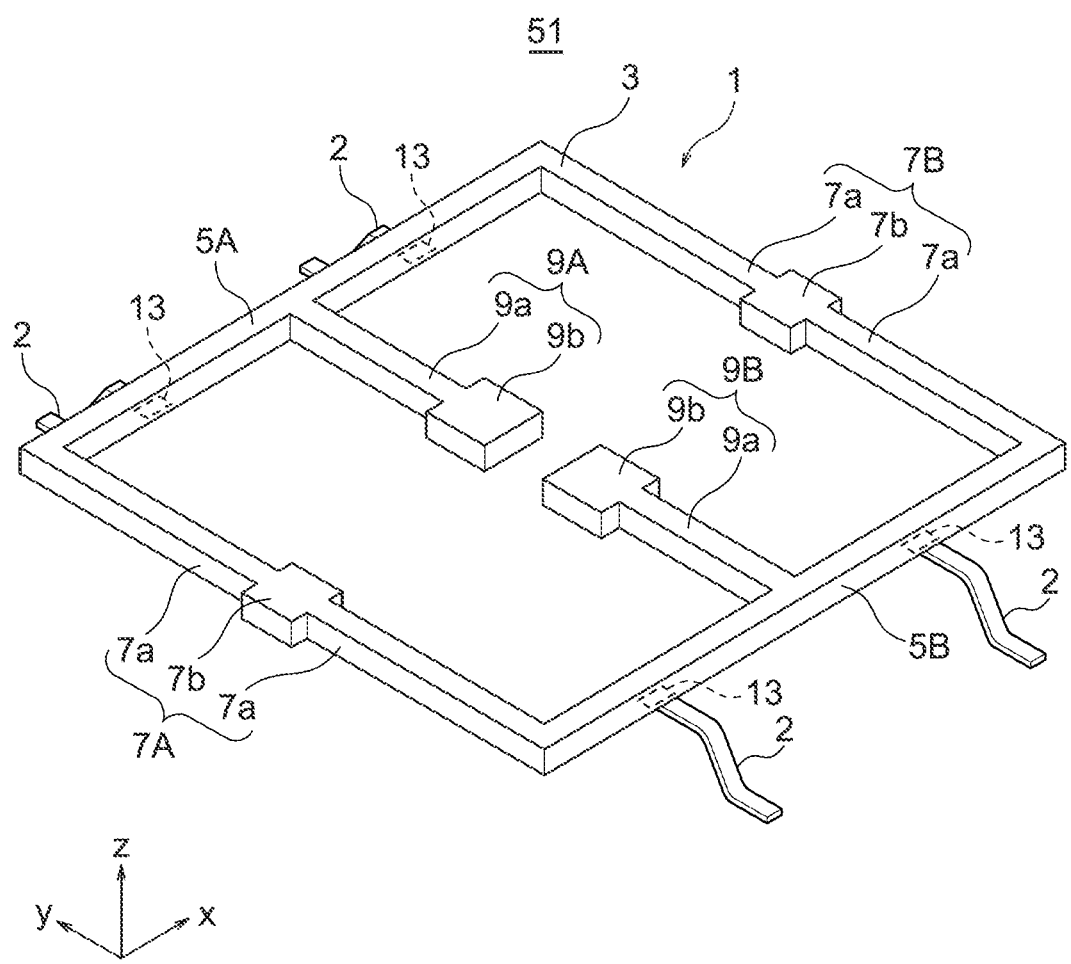
FIG. 1 is a perspective view showing a sensor element according to an embodiment of the present disclosure.

FIG. 1 is a perspective view showing the configuration of an angular velocity sensor 51 according to a first embodiment (particularly a sensor element 1). Note that, in this view, basically illustration of a conductive layer provided on the surface of the sensor element 1 is omitted.

The angular velocity sensor 51 is for example a piezoelectric vibration type which detects the angular velocity around the x-axis and has a sensor element 1 and a plurality of (four in the example shown) terminals 2 which support the sensor element 1. The sensor element 1 has a piezoelectric body 3. When the piezoelectric body 3 is rotated in a state where voltage is applied to the piezoelectric body 3 and the piezoelectric body 3 is vibrating, vibration due to a Coriolis force is generated in the piezoelectric body 3. By detecting the voltage generated according to the vibration due to the Coriolis force, the angular velocity is detected. Specifically, this is as follows.

(Shape of Piezoelectric Body)

The piezoelectric body 3 is for example integrally formed as a whole. The piezoelectric body 3 may be a single crystal or polycrystal. Further, the material of the piezoelectric body 3 may be suitably selected. It is for example quartz crystal ($SiO_2$), $LiTaO_3$, $LiNbO_3$, PZT, or silicon.

In the piezoelectric body 3, the electrical axis or polarization axis (below, sometimes only the polarization axis will be referred to as the representative of the two) is set so as to coincide with the x-axis. Note that, the polarization axis may be inclined relative to the x-axis in a predetermined range (for example not more than 15°) as well. Further, in a case where the piezoelectric body 3 is a single crystal, the mechanical axis and optical axis may be set in suitable directions. For example, the mechanical axis is set in the y-axis direction, and the optical axis is set in the z-axis direction.

In the piezoelectric body 3, for example, the thickness (z-axis direction) is made constant as a whole. Further, the piezoelectric body 3 is for example formed in a linearly symmetrical shape relative to a not shown symmetrical axis parallel to the y-axis and in a linearly symmetrical shape relative to a not shown symmetrical axis parallel to the x-axis.

The piezoelectric body 3 has for example a pair of frames 5A and 5B, a pair of drive arms 7A and 7B laid bridging the pair of frames 5, and a pair of detection arms 9A and 9B extending from the pair of frames 5.

The pair of drive arms 7 are parts excited by application of voltages (electric fields). The detection arms 9 are parts which vibrate according to a Coriolis force and generate electrical signals (for example voltages) corresponding to the angular velocity. The frames 5 are parts which contribute to transfer of vibrations from the drive arms 7 to the detection arms 9.

The pair of frames 5 face each other in the y-axis direction. The frames 5 are for example formed in long shapes so as to linearly extend in the x-axis direction. The cross-sectional shapes of the frames 5 are for example substantially rectangular. One of the widths (y-axis direction) and thicknesses (z-axis direction) of the frames 5 may be larger than the others as well. However, the frames 5 are planned to deform to bend when viewed on a plane as will be explained later. Accordingly, the widths of the frames 5 may be made relatively small. For example, the widths of the frames 5 may be made not more than 2 times or not more than 1 time the thicknesses of the frames 5. Further, for example, the lengths and widths of the frames 5 may be adjusted so that the natural frequencies of the bending deformation become closer to the natural frequencies of the drive arms 7 in the direction being excited due to application of voltages and/or the natural frequencies of the detection arms 9 in the directions of vibrations due to the Coriolis force.

The pair of drive arms 7 are laid bridging the pair of frames 5 and face each other in the x-axis direction. Accordingly, the pair of frames 5 and pair of drive arms 7 configure a frame shape (annular shape) surrounding an opening as a whole. The drive arms 7 are for example formed in long shapes so as to linearly extend in the y-axis direction. The pair of frames 5 and the pair of drive arms 7 are for example connected with each other at their two ends to thereby form a rectangle.

The concrete shapes etc. of the drive arms 7 may be suitably set. For example, the drive arms 7 are widened at the centers in their long directions more than the other portions. That is, the drive arms 7 have pairs of body portions 7a extending from the pair of frames 5 and broad portions 7b which are positioned between the pairs of body portions 7a and have broader widths than the pairs of body portions 7a. The body portions 7a have for example constant cross-sectional shapes over substantially their entireties in their long directions. However, the drive arms 7 need not be provided with such broad portions 7b. The cross-sectional shapes may be constant over substantially their entireties in their long directions. The cross-sectional shapes (xz plane) of the body portions 7a and broad portions 7b are for example rectangular.

The drive arms 7, as will be explained later, are excited in the x-axis direction. Accordingly, in the drive arms 7, the larger the widths (x-axis direction) thereof, the higher the natural frequencies in the excitation direction (x-axis direction). Further, the larger the lengths (from another viewpoint, mass) thereof, the lower the natural frequencies in the excitation direction. The various dimensions of the drive arms 7 are for example set so that the natural frequencies of the drive arms 7 in the excitation direction becomes close to the frequencies at which excitation is to be caused.

The pair of detection arms 9 extend from the pair of frames 5 in the y-axis direction. Their front ends are formed as free ends. Further, the pair of detection arms 9 for example extend to the inner sides of the pair of frames 5 (between the pair of frames 5). The connection positions of the detection arms 9 with respect to the frames 5 (x-axis direction) are between the pair of drive arms 7. For example, they are positioned at the center between the drive arms 7.

The concrete shapes etc. of the detection arms 9 may be suitably set. For example, the detection arms 9 are hammer shaped so as to become broader in widths (x-axis direction) at the front end side portions. That is, the detection arms 9 have body portions 9a and broad portions 9b which are positioned on the front ends of the body portions 9a and have broader widths than the body portions 9a. The body portions 9a have for example constant cross-sectional shapes over substantially their entireties in their long directions. However, the detection arms 9 need not be provided with such broad portions 9b, and the cross-sectional shapes may be constant over their entireties in their long directions. The cross-sectional shapes (xz plane) of the body portions 9a and broad portions 9b are for example rectangular.

The detection arms 9, as will be explained later, vibrate in the z-axis direction due to the Coriolis force in the present embodiment. Accordingly, in the detection arms 9, the larger the thicknesses (z-axis direction) thereof, the higher the natural frequencies in the vibration direction (z-axis direction). Further, the larger the lengths (from another viewpoint, the mass) thereof, the lower the natural frequencies in the vibration direction. The various dimensions of the detection arms 9 are for example set so that the natural frequencies in the vibration direction of the detection arms 9 become close to the natural frequencies in the excitation direction of the drive arms 7.

(Pads and Terminals)

The plurality of terminals 2 are ones for mounting the sensor element 1 on a not shown mounting body (for example a portion of a package or a circuit board). The plurality of terminals 2 are for example configured so as to resiliently support the sensor element 1 so as to permit parallel movement and/or rotational movement of the joined positions of the plurality of terminals 2 and the sensor element 1 and consequently so as to be able to permit vibration of the piezoelectric body 3 which will be explained later. In the example shown, the terminals 2 are configured by long shaped sheet metals which are relatively small in thicknesses and widths and have suitable bent portions.

The sensor element 1 is for example arranged so that its lower surface faces a not shown mounting body. The plurality of terminals 2 are for example joined at one end side portions with a plurality of pads 13 provided on the surface (for example lower surface) of the piezoelectric body 3 and are joined at the other end side portions to not shown pads on the mounting body. Due to this, the sensor element 1 and the mounting body are electrically connected. Further, the sensor element 1 (piezoelectric body 3) is supported in a state able to vibrate.

The positions of the plurality of pads 13 in the piezoelectric body 3 may be suitably set. The example shown shows an embodiment in which four pads 13 are provided at the pair of frames (two sides). Other than this, for example, four pads 13 may be provided at the pair of drive arms 7 (two sides), four pads 13 may be provided at the pair of frames 5 and pair of drive arms 7 (four sides), or four pads 13 may be provided at four corner portions formed by the pair of frames 5 and pair of drive arms 7.

(Excitation Electrodes, Detection Electrodes, and Wiring)

Figure 2A:
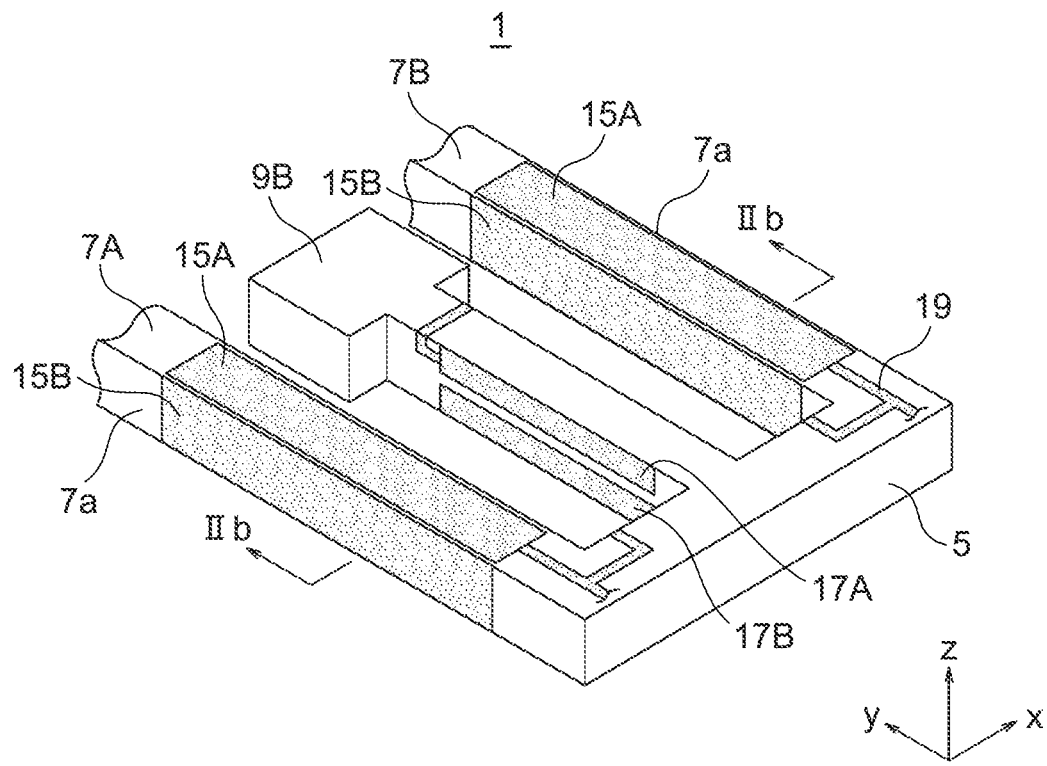
FIG. 2A is a perspective view showing a portion of the sensor element in FIG. 1 in an enlarged manner.
Figure 2B:
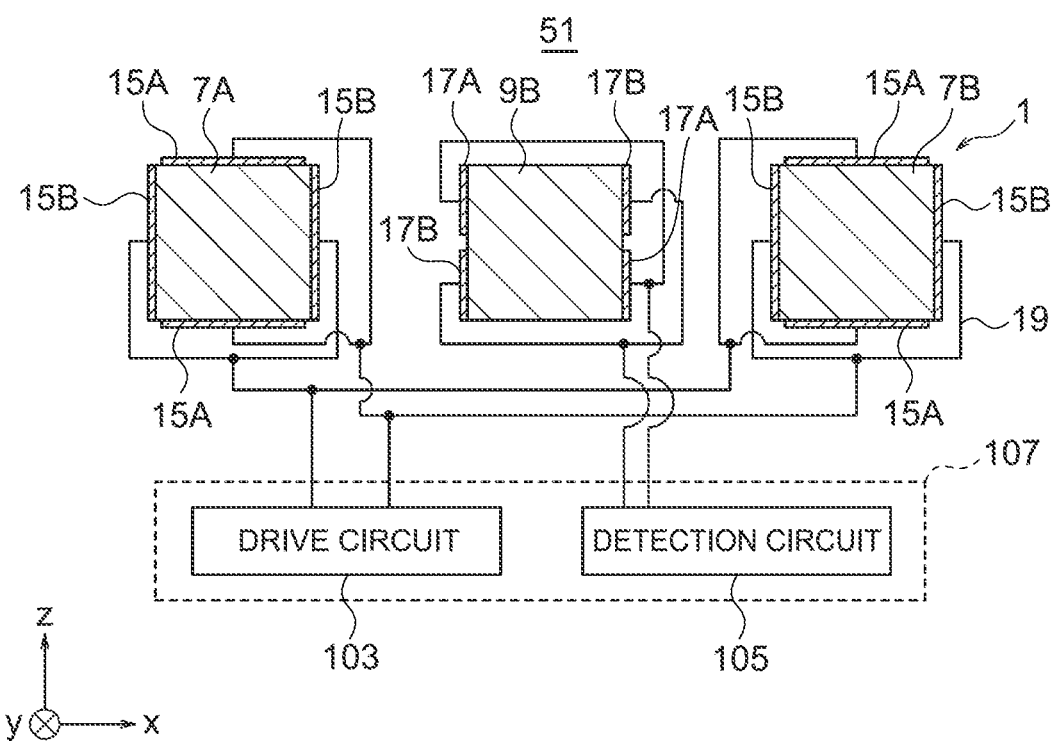
FIG. 2B is a cross-sectional view taken along the IIb-IIb line in FIG. 2A.

FIG. 2A is a perspective view showing a portion of the sensor element 1 in an enlarged manner. Further, FIG. 2B is a cross-sectional view taken along the IIb-IIb line in FIG. 2A.

The sensor element 1 has excitation electrodes 15A and 15B for applying voltages to the drive arms 7, detection electrodes 17A and 17B for extracting signals generated in the detection arms 9, and a plurality of wirings 19 connecting them. They are configured by a conductive layer formed on the surface of the piezoelectric body 3. The material of the conductive layer is for example Cu, Al, or another metal.

Note that, the additional notations "A" and "B" of the excitation electrodes 15 and detection electrodes 17 are attached based on the orthogonal coordinate system xyz. Accordingly, as will be explained later, the excitation electrode 15A of one drive arm 7 and the excitation electrode 15A of the other drive arm 7 do not always have the same potential. The same is true also for the excitation electrodes 15B and detection electrodes 17A and 17B.

In each drive arm 7, the excitation electrodes 15A are provided on each of the upper surface and lower surface (a pair of surfaces which face the two sides in the z-axis direction). Further, in each drive arm 7, the excitation electrodes 15B are provided on each of a pair of side surfaces (pair of surfaces which face the two sides in the x-axis direction).

The pair of excitation electrodes 15A and pair of excitation electrodes 15B are for example provided in each of the two body portions 7a in each drive arm 7 (eight excitation electrodes 15 are provided for one drive arm 7). In each drive arm 7, the pair of excitation electrodes 15A of one body portion 7a and the pair of excitation electrodes 15A of the other body portion 7a are connected by the wirings 19. In the same way, in each drive arm 7, the pair of excitation electrodes 15B of one body portion 7a and the pair of excitation electrodes 15B of the other body portion 7a are connected by the wirings 19.

Though not particularly shown, in each drive arm 7, a pair of excitation electrodes 15A and/or pair of excitation electrodes 15B may be provided over substantially the entirety in its long direction as well (without differentiation of the two body portions 7a). For example, four excitation electrodes 15 may be provided at each drive arm 7 as well. In particular, in such an embodiment where a broad portion 7b is not provided, the formation of such excitation electrodes 15 over the entirety in the long direction of each drive arm 7 is easy.

As will be understood from the above description, in the explanation of the excitation electrodes 15, it is not necessary to differentiate between whether the excitation electrodes 15 are provided for each body portion 7a. In the following description, even if the pair of excitation electrodes 15A and pair of excitation electrodes 15B are provided for each body portion 7a, sometimes it will be expressed that the pair of (two) excitation electrodes 15A and pair of (two) excitation electrodes 15B are provided in one drive arm 7.

On the upper, lower, left, and right surfaces of each drive arm 7 (each body portion 7a), the excitation electrodes 15 are for example formed so as to cover over the major parts of the surfaces. However, at least some of the excitation electrodes 15A and 15B (excitation electrodes 15A in the present embodiment) are formed smaller in the width direction than the surfaces so that the electrodes will not be short-circuited with each other. Further, portions of the drive arms 7 on the frame 5 side and on the broad portion 7b side may be set aside as positions where no excitation electrodes 15 are arranged.

In each drive arm 7 (each body portion 7a), the pair of excitation electrodes 15A are for example given the same potentials as each other. For example, the pair of excitation electrodes 15A are mutually connected by the wiring 19. Further, in each drive arm 7, the pair of excitation electrodes 15B are for example given the same potentials as each other. For example, the two excitation electrodes 15B are mutually connected by the wiring etc. on the piezoelectric body 3.

In such an arrangement and connection relationships of the excitation electrodes 15, when voltages are applied to the excitation electrodes 15A and the excitation electrodes 15B, for example, in the drive arm 7, an electric field from the upper surface toward the pair of side surfaces (the two sides in the x-axis direction) and an electric field from the lower surface toward the pair of side surfaces are generated. On the other hand, the polarization axis coincides with the x-axis direction. Accordingly, when paying attention to the components in the x-axis direction of the electric fields, the orientation of the electric field and the orientation of the polarization axis coincide in one side portion in the x-axis direction in the drive arm 7, while the orientation of the electric field and the orientation of the polarization axis become reverse in the other side portion.

As a result, in each drive arm 7, one side portion in the x-axis direction contracts in the y-axis direction, and the other side portion extends in the y-axis direction. Further, the drive arm 7 is curved to one side of the x-axis direction like a bimetal. If the voltages applied to the excitation electrodes 15A and 15B are inverted, the drive arm 7 is curved to a reverse direction. According to such a principle, when an AC voltage is applied to the excitation electrodes 15A and 15B, the drive arm 7 vibrates in the x-axis direction.

Note that, although not particularly shown, on the upper surface and/or lower surface of each drive arm 7, one or more recessed grooves extending along the long direction of the drive arm 7 (the recessed groove may be configured by concave portions arranged in the long direction of the drive arm 7 as well) may be provided, and the excitation electrode 15A may be provided over the interior of this recessed groove as well. This case results due to the excitation electrode 15A and the excitation electrode 15B facing each other in the x-axis direction while sandwiching the wall portion of the recessed groove therebetween, therefore the efficiency of excitation is improved.

In the pair of drive arms 7, the excitation electrodes 15A on the drive arm 7A and the excitation electrodes 15B on the drive arm 7B are given the same potential, and the excitation electrodes 15B on the drive arm 7A and the excitation electrodes 15A on the drive arm 7B are given the same potential. For example, the excitation electrodes 15 to be given the same potential are mutually connected by the wiring 19.

Accordingly, if an AC voltage is applied to the excitation electrodes 15A and the excitation electrodes 15B in such connection relationships, voltages of mutually reverse phases are applied to the pair of drive arms 7, therefore they vibrate so as to deform bending in mutually reverse directions in the x-axis direction.

The detection electrodes 17A, in each detection arm 9, are provided in each of a region on the positive side of the z-axis direction in the surface facing the negative side of the x-axis direction (for example the positive side from the center of this surface) and a region on the negative side of the z-axis direction in the surface facing the positive side of the x-axis direction (for example the negative side from the center of this surface). The detection electrodes 17B, in each detection arm 9, are provided in each of a region on the negative side of the z-axis direction in the surface facing the negative side of the x-axis direction (for example the negative side from the center of this surface) and a region on the positive side of the z-axis direction in the surface facing the positive side of the x-axis direction (for example the positive side from the center of this surface).

Note that, FIG. 2A and FIG. 2B show only the detection arm 9B. However, this same is true also for the detection arm 9A and for each detection arm 9 in the other embodiments which will be explained later. That is, the additional notation A of a detection electrode 17 corresponds to the region of +z on the side surface of −x and to the region of −z on the side surface of +x, and the additional notation B of a detection electrode 17 corresponds to the region of −z on the side surface of −x and to the region of +z on the side surface of +x.

On each side surface of each detection arm 9, the detection electrodes 17A and 17B extend along the detection arm 9 while being suitably spaced apart from each other so as not to be mutually short-circuited. In each detection arm 9, the two detection electrodes 17A are mutually connected, and the two detection electrodes 17B are mutually connected. The connections are for example achieved by a plurality of wirings 19.

In such arrangements and connection relationships of the detection electrodes 17, if the detection arm 9 deforms bending in the z-axis direction, for example, an electric field parallel to the z-axis direction is generated. That is, on each side surface of the detection arm 9, a voltage is generated between the detection electrode 17A and the detection electrode 17B. The orientation of the electric field is determined by the orientation of the polarization axis and the orientation of the curve (positive side or negative side of the z-axis direction). The orientations of the electric fields are reverse to each other between the positive side portion and the negative side portion of the x-axis direction. These voltages (electric fields) are output to the detection electrodes 17A and detection electrodes 17B. When the detection arm 9 vibrates in the z-axis direction, the voltages are detected as the AC voltage. Note that, among the electric fields, the electric field parallel to the z-axis direction as described above may be dominant or the ratio of the electric fields which are parallel to the x-axis direction and have mutually reverse orientations between the positive side portion and the negative side portion of the z-axis direction may be larger. In any case, voltage in accordance with the bending deformation to the z-axis direction of the detection arm 9 is generated between the detection electrode 17A and the detection electrode 17B.

Note that, although not particularly shown, in each detection arm 9, one or more through grooves (slits) penetrating through it from the upper surface to the lower surface and extending along the long direction of the detection arm 9 may be formed as well. Further, in each of the two or more long shaped portions divided by the through grooves, like in the detection arm 9 in the example shown, the detection electrodes 17A and 17B may be arranged and connected as well. In this case, the plurality of detection electrodes 17 become larger in area as a whole in comparison with the case where they are provided only on the outer side surfaces of the detection arm 9. As a result, a charge generated in the detection arm 9 can be efficiently extracted as an electrical signal.

In the pair of detection arms 9, in the present embodiment, the detection electrodes 17A in the detection arm 9A and the detection electrodes 17B in the detection arm 9B are connected, and the detection electrodes 17B in the detection arm 9A and the detection electrodes 17A in the detection arm 9B are connected. The connections are for example made by the plurality of wirings 19.

In such connection relationships, when the pair of detection arms 9 vibrate so as to warp to the mutually reverse sides in the z-axis direction, signals generated in the two are added.

The wirings 19 connect the excitation electrodes 15 and the detection electrodes 17 as explained above. Further, they connect four sets in total of electrodes of two sets of the excitation electrodes 15 divided from the viewpoint of the potential and two sets of the detection electrodes 17 divided from the viewpoint of the potential to the four pads 13. By the plurality of wirings 19 being suitably arranged on the upper surfaces, lower surfaces, and/or side surfaces of various parts in the piezoelectric body 3, in an embodiment where all of the wirings are provided on the surfaces of the piezoelectric body 3, the above connections can be realized without short-circuiting with each other. Note that, by providing an insulation layer on the wirings 19 positioned on the piezoelectric body 3 and providing the other wirings 19 on that, a three-dimensional wiring portion may be formed as well.

As shown in FIG. 2B, the angular velocity sensor 51 has a drive circuit 103 applying voltages to the excitation electrodes 15 and a detection circuit 105 detecting the electrical signals from the detection electrodes 17.

The drive circuit 103 is for example configured including an oscillation circuit and amplifier and applies an AC voltage having a predetermined frequency to the excitation electrodes 15A and the excitation electrodes 15B. Note that, the frequency may be determined in advance in the angular velocity sensor 51 or may be designated from an apparatus in an external portion.

The detection circuit 105 is configured including for example an amplifier and wave detecting circuit, detects a potential difference between the detection electrodes 17A and the detection electrodes 17B, and outputs an electrical signal in accordance with the detection result to the apparatus in the external portion or the like. More specifically, for example, the above potential difference is detected as the AC voltage, and the detection circuit 105 outputs a signal in accordance with the amplitude of the detected AC voltage. The angular velocity is specified based on this amplitude. Further, the detection circuit 105 outputs a signal in accordance with a phase difference between the application voltage of the drive circuit 103 and the electrical signal detected. The orientation of rotation is specified based on this phase difference.

Note that, the drive circuit 103 and the detection circuit 105 configure a control circuit 107 as a whole. The control circuit 107 is configured by for example an IC (integrated circuit) chip and is mounted on a circuit board or a mounting body having a suitable shape on which the sensor element 1 is mounted.

(Operation of Angular Velocity Sensor)

Figure 3A:
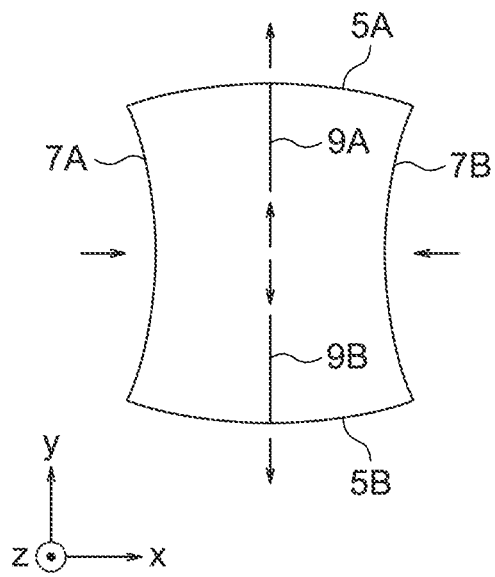
FIG. 3A, FIG. 3B, FIG. 3C, and FIG. 3D are schematic views for explaining the mode of operation of the sensor element in FIG. 1.
Figure 3B:
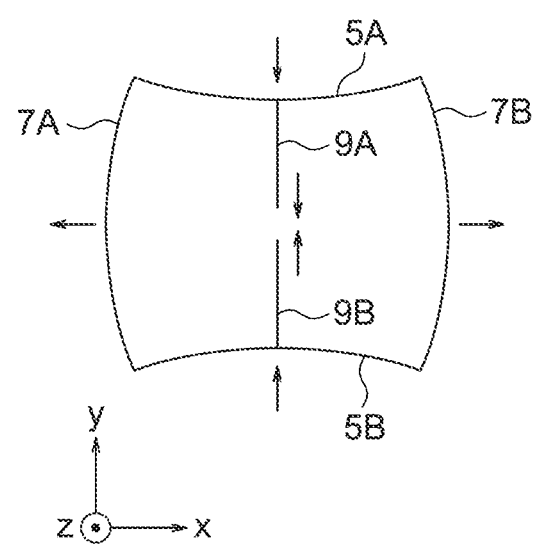

FIG. 3A and FIG. 3B are schematic plan views for explaining the excitations in the piezoelectric body 3. In FIG. 3A and FIG. 3B, phases of the AC voltages applied to the excitation electrodes 15 are mutually offset by 180°.

As explained above, the drive arms 7A and 7B are excited with mutually reverse phases so as to deform in mutually reverse orientations in the x-axis direction by application of the AC voltages to the excitation electrodes 15.

At this time, as shown in FIG. 3A, if the pair of drive arms 7 warp to the inner sides of the pair of drive arms 7 in the x-axis direction, the bending moments thereof are transferred to the pair of frames 5, therefore the pair of frames 5 warp to the outer sides of the pair of frames 5 in the y-axis direction. As a result, the pair of detection arms 9 are displaced to the outer sides of the pair of frames 5 in the y-axis direction.

Conversely, as shown in FIG. 3B, if the pair of drive arms 7 warp to the outer sides of the pair of drive arms 7 in the x-axis direction, the bending moments thereof are transferred to the pair of frames 5, therefore the pair of frames 5 warp to the inner sides of the pair of frames 5 in the y-axis direction. As a result, the pair of detection arms 9 are displaced to the inner sides of the pair of frames 5 in the y-axis direction.

Accordingly, by excitation of the pair of drive arms 7, the pair of detection arms 9 end up vibrating in the y-axis direction.

Figure 3C:
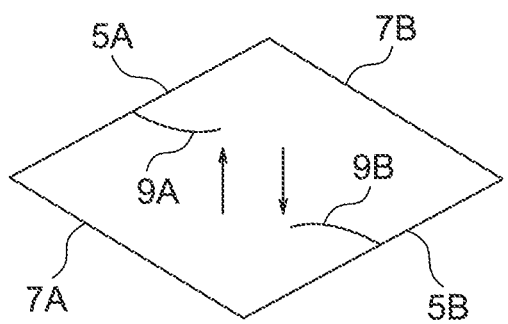
Figure 3D:
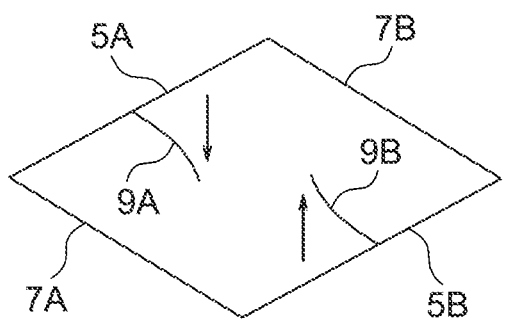

FIG. 3C and FIG. 3D are schematic perspective views for explaining the vibration of the pair of detection arms 9 due to the Coriolis force. FIG. 3C and FIG. 3D correspond to the states in FIG. 3A and FIG. 3B. Note that, in these views, illustration of deformations of the drive arms 7 and frames 5 is omitted. The same is true also for the schematic views for explaining the vibrations of the detection arms 9 in the other embodiments which will be explained later.

When the sensor element 1 is rotated around the x-axis in the state where the piezoelectric body 3 is vibrating as explained with reference to FIG. 3A and FIG. 3B, since the pair of detection arms 9 are vibrating (are being displaced) in the y-axis direction, vibration (deformation) is caused in the direction (z-axis direction) perpendicular to the rotation axis (x-axis) and to the vibration direction (y-axis) due to the Coriolis force.

Further, the pair of detection arms 9 vibrate so as to be displaced to the mutually reverse sides in the y-axis direction, therefore they are displaced to mutually the same sides in the rotation direction around the x-axis due to the Coriolis force. From another viewpoint, the pair of detection arms 9 are displaced to the mutually reverse sides in the z-axis direction.

Further, the signals (voltages) generated due to the deformations of the detection arms 9 are extracted by the detection electrodes 17. The signals extracted in the pair of detection arms 9 are added and the result is output from the pads 13. The larger the angular velocity, the larger the Coriolis force (consequently the voltage of the signal detected). Due to this, the angular velocity is detected.

As described above, the angular velocity sensor 51 has the piezoelectric body 3, drive circuit 103, and detection circuit 105. The piezoelectric body 3 has the pair of frames 5, the pair of drive arms 7, and the pair of detection arms 9. The pair of frames 5 face each other in the y-axis direction in the orthogonal coordinate system xyz. The pair of drive arms 7 are respectively laid bridging the pair of frames 5 and face each other in the x-axis direction. The pair of detection arms 9 extend from the pair of frames 5 in the y-axis direction at positions between the pair of drive arms 7 in the x-axis direction. The drive circuit 103 applies voltages of mutually reverse phases to the pair of drive arms 7 so that the pair of drive arms 7 vibrate bending to the mutually reverse sides in the x-axis direction. The detection circuit 105 detects the signals generated due to the bending deformations in the z-axis direction or x-axis direction (z-axis direction in the present embodiment) of the pair of detection arms 9.

From another viewpoint, the sensor element 1 has the piezoelectric body 3, the plurality of excitation electrodes 15, the plurality of detection electrodes 17, and the plurality of wirings 19. The piezoelectric body 3 has the pair of frames 5, the pair of drive arms 7, and the pair of detection arms 9. The pair of frames 5 face each other in the y-axis direction in the orthogonal coordinate system xyz. The pair of drive arms 7 are respectively laid bridging the pair of frames 5 and face each other in the x-axis direction. The pair of detection arms 9 extend from the pair of frames 5 in the y-axis direction at positions between the pair of drive arms 7 in the x-axis direction. The plurality of excitation electrodes 15 are provided in an arrangement capable of applying voltages exciting the pair of drive arms 7 in the x-axis direction. The plurality of detection electrodes 17 are provided in an arrangement capable of detecting the signals generated by the vibration in the x-axis direction or z-axis direction (z-axis direction in the present embodiment) of the detection arms 9. The plurality of wirings 19 connect the plurality of excitation electrodes 15 so that voltages of mutually reverse phases are applied from the plurality of excitation electrodes 15 to the pair of drive arms 7 so that the pair of drive arms 7 vibrate bending to mutually reverse sides in the x-axis direction.

Accordingly, detection according to a new mode of vibration becomes possible so that the frames 5 are curved (vibrate) according to the excitations of the pair of drive arms 7, the detection arms 9 are displaced (vibrate), and the angular velocity is detected due to the Coriolis force acting upon these detection arms 9 being displaced.

As a comparative example, for example, there can be mentioned one making the Coriolis force act on the drive arms being excited, thereby vibrating them, and transferring the vibration according to this Coriolis force to the detection arms. In the present embodiment, unlike such a comparative example, the Coriolis force directly acts upon the detection arms. As a result, for example the detection sensitivity is improved.

Further, as a comparative example, for example, there can be mentioned an embodiment where the detection arms are deformed bending (vibrating) in the same direction as the vibration direction (x-axis direction) of the drive arms, and the Coriolis force is made act upon these vibrating detection arms. The present embodiment is different from such an embodiment in the vibration direction of the detection arms, and it becomes possible to detect the angular velocity for the rotation axis (x-axis) for which the angular velocity could not be detected in the comparative example explained before.

Further, as a comparative example, for example, there can be mentioned a piezoelectric body in which the pair of drive arms 7 and one detection arm 9 extend from one frame 5 in a cantilever manner wherein in the same way as the present embodiment the frame 5 is made to warp in the y-axis direction by the vibration in the x-axis direction of the pair of drive arms 7 to thereby make the detection arm 9 vibrate in the y-axis direction (this comparative example is new). In comparison with this, in the present embodiment, the two ends of each of the pair of drive arms 7 are connected to the pair of frames 5, and each frame 5 is provided with a detection arm 9, therefore the vibration of the pair of drive arms 7 is efficiently transferred to the pair of detection arms 9. As a result, for example the detection sensitivity is improved.

Further, in the present embodiment, the pair of detection arms 9 extend toward the inner sides of the pair of frames 5. That is, the pair of detection arms 9 are positioned in an opening configured by the pair of frames 5 and pair of drive arms 7. Accordingly, for example, in comparison with an embodiment where the detection arms 9 extend to the outer sides of the pair of frames 5 (this embodiment is also included in the present disclosure), the sensor element 1 is reduced in size.

Second Embodiment (Configuration of Angular Velocity Sensor)

Figure 4A:
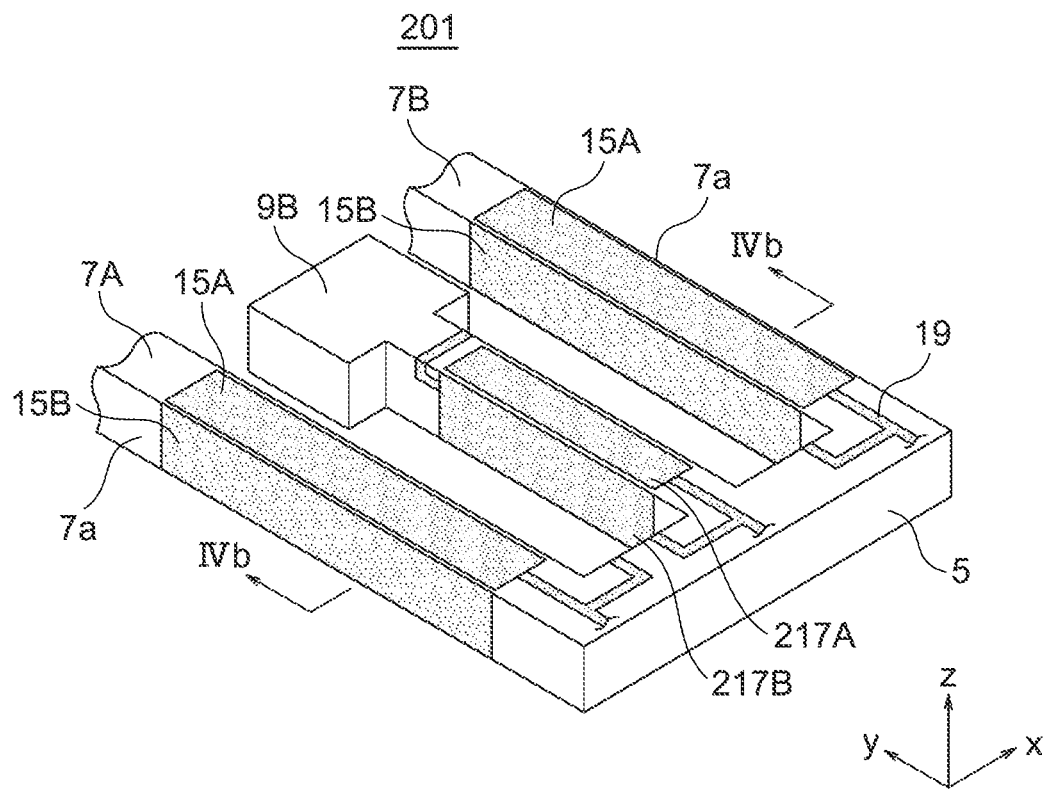
FIG. 4A is a perspective view showing a portion of a sensor element according to a second embodiment in an enlarged manner.
Figure 4B:
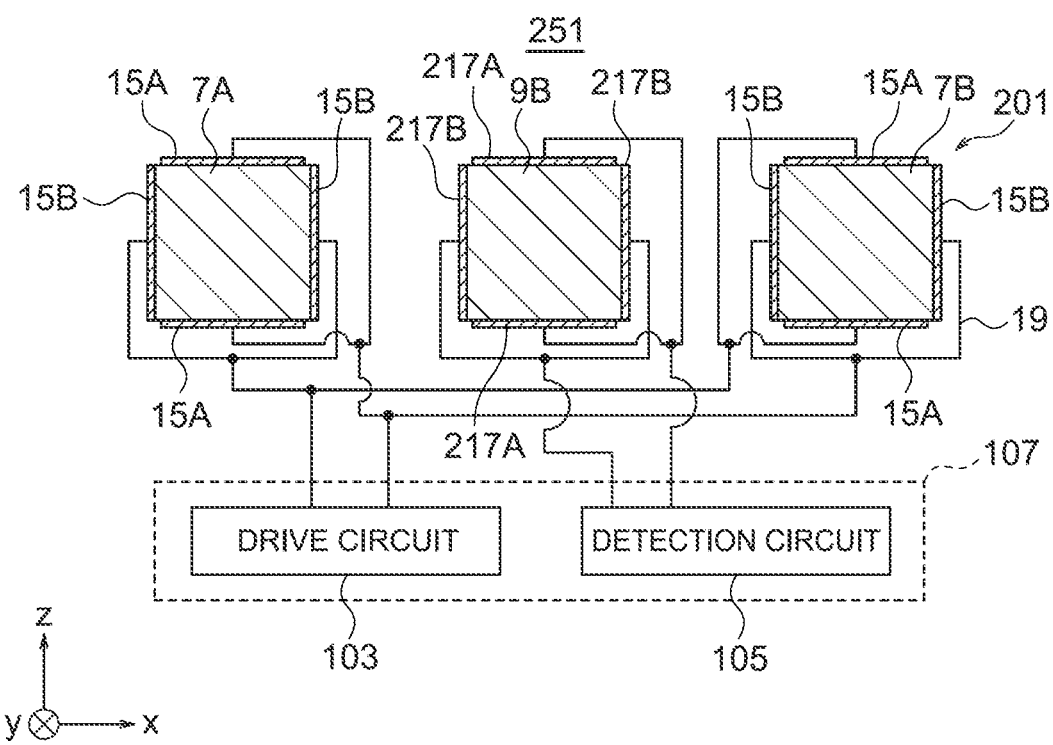
FIG. 4B is a cross-sectional view taken along the IVb-IVb line in FIG. 4A.

FIG. 4A is a perspective view the same as FIG. 2A showing a portion of a sensor element 201 according to a second embodiment in an enlarged manner. FIG. 4B is a view the same as FIG. 2B showing an angular velocity sensor 251 according to the second embodiment and includes a cross-sectional view corresponding to the IVb-IVb line in FIG. 4A.

The angular velocity sensor 251 according to the second embodiment, in the same way as the angular velocity sensor 51 according to the first embodiment, makes the pair of drive arms 7 vibrate in the x-axis direction to thereby make the frames 5 curve (vibrate), whereby in turn the detection arms 9 are displaced (vibrate) in the y-axis direction. Further, the Coriolis force is made to directly act upon the detection arms 9. However, in contrast to the angular velocity sensor 51 detecting the rotation around the x-axis, the angular velocity sensor 251 is formed to detect rotation around the z-axis. Specifically, this is as follows.

The sensor element 201 has a piezoelectric body 3, a plurality of excitation electrodes 15, a plurality of detection electrodes 217, a plurality of pads 13 (not shown here), and a plurality of wirings 19. As understood from these notations, except for the plurality of detection electrodes 217 (and the wirings 19 concerned with them), the fundamental configuration of the sensor element 201 may be made substantially the same as the sensor element 1 in the first embodiment. FIG. 1 may be grasped as a perspective view showing the angular velocity sensor 251.

However, in the present embodiment, unlike the first embodiment, it is intended that the detection arms 9 vibrate in the x-axis direction due to the Coriolis force. Due to such a difference, various dimensions may be different from those in the first embodiment.

For example, in the detection arms 9, the larger the widths thereof (x-axis direction), the higher the natural frequencies in the vibration direction (x-axis direction). The larger the lengths thereof (from another viewpoint, mass), the lower the natural frequencies in the vibration direction. The various dimensions of the detection arms 9 are for example set so that the natural frequencies of the detection arms 9 in the vibration direction become closer to the natural frequencies of the drive arms 7 in the excitation direction.

The detection electrodes 217A and 217B are ones extracting the signals generated due to the bending deformations of the detection arms 9 in the x-axis direction. Therefore, for example, they are given the same configurations as those of the excitation electrodes 15A and 15B for exciting the drive arms 7 in the x-axis direction. Accordingly, the explanation for the excitation electrodes 15 in the first embodiment may be used as the explanation for the detection electrodes 217 by replacing the excitation electrodes 15 by the detection electrodes 217. The same is true also for the mutual connection of the pair of detection electrodes 217A and the mutual connection of the pair of detection electrodes 217B.

In the first embodiment, reference was made to the effect that slits penetrating from the upper surface to the lower surface may be provided in the detection arms 9. In the second embodiment, in the same way as the drive arms 7, the detection arms 9 may be provided with recessed grooves in the upper surfaces and/or lower surfaces thereof.

(Operation of Angular Velocity Sensor)

The excitation of the piezoelectric body 3 in the second embodiment is the same as that in the first embodiment. FIG. 3A and FIG. 3B may be grasped as views showing the excitation states of the piezoelectric body 3 in the second embodiment. Accordingly, the pair of drive arms 7 vibrate so as to mutually approach or be separated in the x-axis direction, and the pair of detection arms 9 are displaced (vibrate) in the y-axis direction.

Figure 5A:
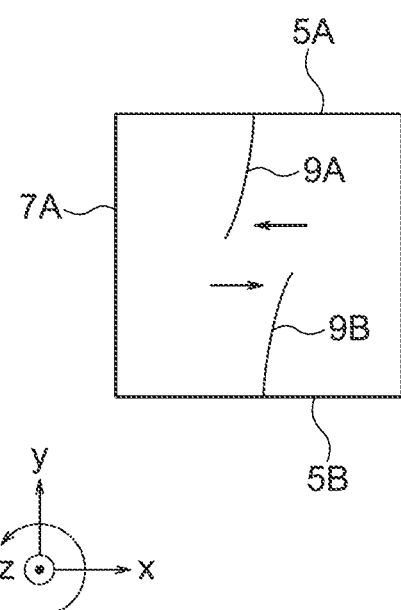
FIG. 5A and FIG. 5B are schematic views for explaining the mode of operation of the sensor element in FIG. 4A.
Figure 5B:
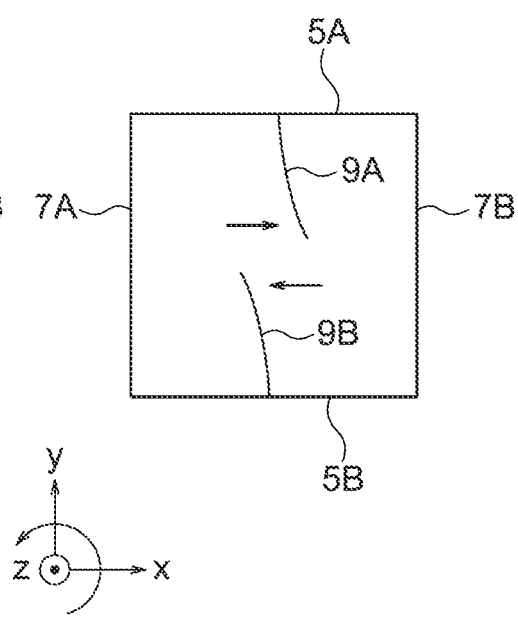

FIG. 5A and FIG. 5B are schematic plan views for explaining the vibration of the detection arms 9 due to the Coriolis force. FIG. 5A and FIG. 5B correspond to the states in FIG. 3A and FIG. 3B.

When the sensor element 1 is rotated around the z-axis in the state where the piezoelectric body 3 is vibrating as explained with reference to FIG. 3A and FIG. 3B, since the pair of detection arms 9 are vibrating (are being displaced) in the y-axis direction, they vibrate (are deformed) in the direction (x-axis direction) perpendicular to the rotation axis (z-axis) and to the vibration direction (y-axis) due to the Coriolis force.

Further, the pair of detection arms 9 vibrate so as to be displaced to the mutually reverse sides in the y-axis direction, therefore they are displaced to mutually the same sides in the rotation direction around the z-axis due to the Coriolis force. From another viewpoint, the pair of detection arms 9 are displaced to the mutually reverse sides in the x-axis direction.

Further, the signals (voltages) generated due to the deformations of the detection arms 9 are extracted by the detection electrodes 17. The signals extracted in the pair of detection arms 9 are added and the result is output from the pads 13 to the detection circuit 105. The larger the angular velocity, the larger the Coriolis force (consequently the voltage of the signal detected). Due to this, the angular velocity is detected.

As described above, in the present embodiment as well, the pair of frames 5 face each other in the y-axis direction, the pair of drive arms 7 are respectively laid bridging the pair of frames 5 and face each other in the x-axis direction, the pair of detection arms 9 extend from the pair of frames 5 in the y-axis direction at positions which are between the pair of drive arms 7 in the x-axis direction, the drive circuit 103 applies voltages of mutually reverse phases to the pair of drive arms 7 so that the pair of drive arms 7 vibrate bending to the mutually reverse sides in the x-axis direction (the plurality of excitation electrodes 15 are arranged so that such voltage application is possible), and the detection circuit 105 detects the signals generated due to the bending deformations in a suitable direction (x-axis direction in the present embodiment) of the detection arms 9 (the plurality of detection electrodes 217 are arranged so that such detection is possible).

Accordingly, the same effects as those by the first embodiment are exerted. For example, detection according to a new mode of vibration becomes possible. Further, for example the Coriolis force acts directly upon the detection arms, therefore an improvement of the detection sensitivity can be expected. Further, for example, it becomes possible to detect the angular velocity about the axis (z-axis) for which the angular velocity could not be detected in the comparative example in which the detection arms were made to deform to bend (vibrate) in the same direction as the vibration direction (x-axis direction) of the drive arms and the Coriolis force was made act upon these vibrating detection arms.

Third and Fourth Embodiments

As understood from the first and second embodiments, in the present disclosure, when comparing the angular velocity sensor detecting the rotation around the x-axis and the angular velocity sensor detecting the rotation around the z-axis, basically, in the configurations thereof, only the configurations of the detection electrodes 17 and 217 (and the wirings 19 concerned with them) are different. In the modes of operation, only the directions in which the Coriolis force acts are different. Therefore, in the following description, sometimes the angular velocity sensor detecting the rotation around the x-axis and the angular velocity sensor detecting the rotation around the z-axis will be explained together, and the notations of both will be attached to the same drawings.

(Configuration of Angular Velocity Sensor)

Figure 6:
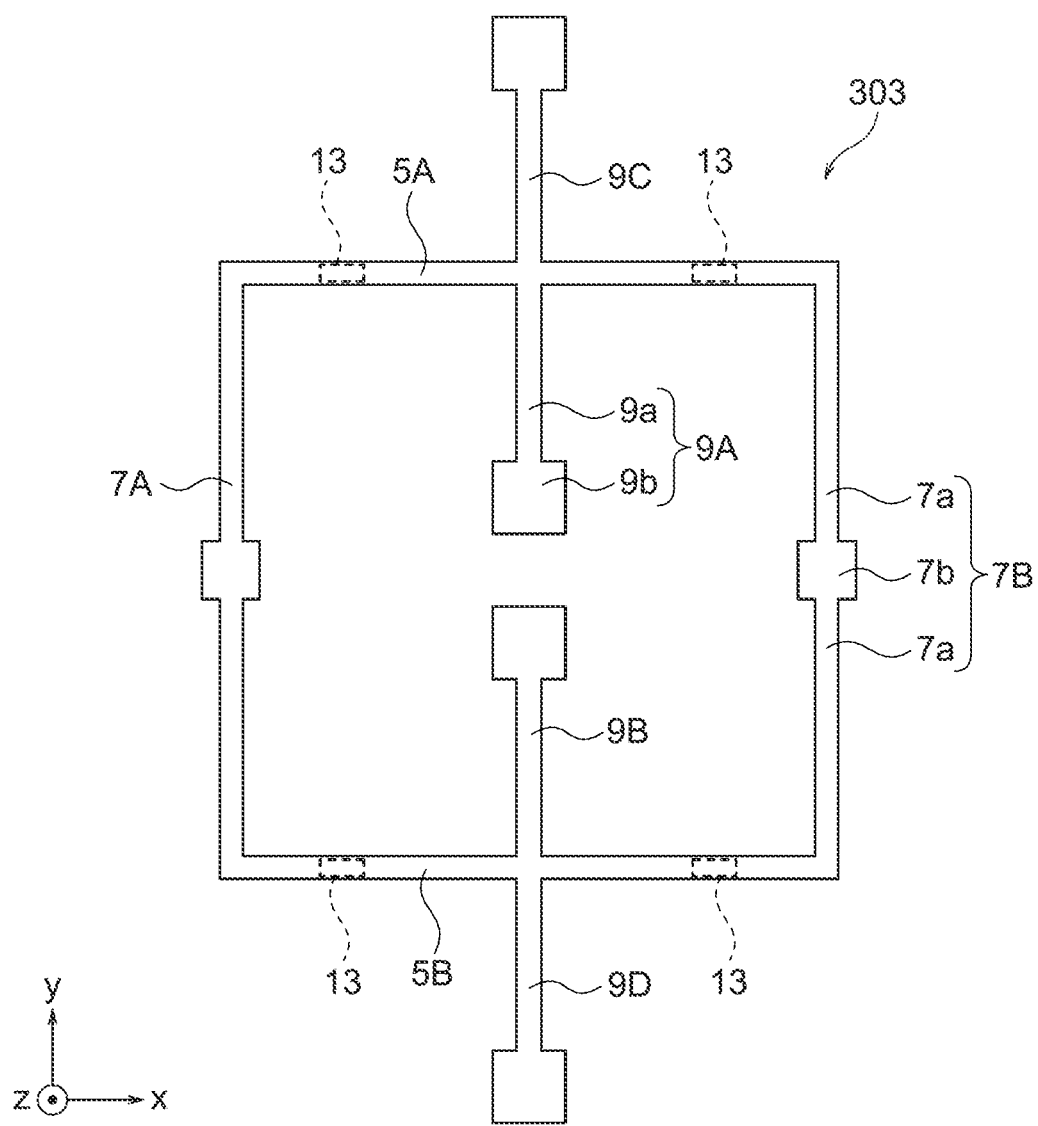
FIG. 6 is a plan view showing the configuration of a sensor element according to a third or fourth embodiment.

FIG. 6 is a plan view showing the configuration of a sensor element 301 according to a third embodiment or a sensor element 401 according to a fourth embodiment.

A piezoelectric body 303 of the sensor element 301 or 401 is one obtained by adding a pair of detection arms 9C and 9D in the piezoelectric body 3 in the first and second embodiments. The detection arms 9C and 9D, in the same way as the detection arms 9A and 9B, extend from the pair of frames 5 in the y-axis direction at positions which are between the pair of drive arms 7 in the x-axis direction. However, the detection arms 9C and 9D extend toward the outer sides of the pair of frames 5 reverse to the detection arms 9A and 9B.

The detection arms 9A and 9C extending from the frame 5A are given for example arrangements and shapes that are linearly symmetrical relative to each other about a symmetric axis comprised of the frame 5A. In the same way, the detection arms 9B and 9D extending from the frame 5B are given for example arrangements and shapes that are linearly symmetrical relative to each other about a symmetric axis comprised of the frame 5B. Note that, they need not be arranged and shaped linearly symmetrically relative to each other.

The detection electrodes provided in the detection arms 9C and 9D are the same as the detection electrodes provided in the detection arms 9A and 9B. For example, in the sensor element 301 detecting the rotation around the x-axis (third embodiment), provision is made of the detection electrodes 17A and 17B according to the first embodiment explained with reference to FIG. 2A and FIG. 2B. In the sensor element 401 detecting the rotation around the z-axis (fourth embodiment), provision is made of the detection electrodes 217A and 217B according to the second embodiment explained with reference to FIG. 4A and FIG. 4B. In each of the detection arms 9C and 9D, the detection electrodes 17A (217A) are mutually connected, and the detection electrodes 17B (217B) are mutually connected. The connection relationships of the detection electrodes among the plurality of detection arms 9 will be explained in the following explanation for the operation.

(Operation of Angular Velocity Sensor)

Although not particularly shown, the excitation states of the piezoelectric body 303 when applying AC voltage to the pair of drive arms 7 in the sensor element 301 or 401 are basically the same as FIG. 3A and FIG. 3B. That is, by the pair of drive arms 7 being excited in the x-axis direction, the pair of frames 5 are curved in the y-axis direction, whereby in turn the detection arms 9 are displaced in the y-axis direction. Note that, in the third and fourth embodiments, not only the detection arms 9A and 9B, but also the detection arms 9C and 9D are displaced. Specifically, the detection arm 9C is displaced together with the detection arm 9A connected to the same frame 5 (5A), and the detection arm 9D is displaced together with the detection arm 9B connected to the same frame 5 (5B).

Figure 7A:
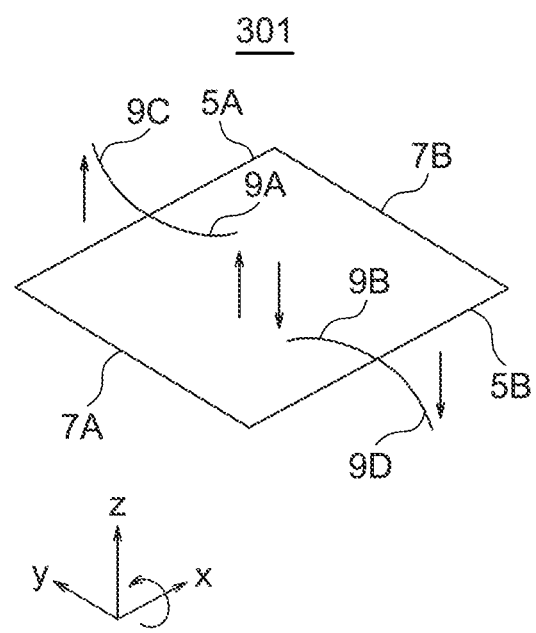
FIG. 7A, FIG. 7B, FIG. 7C, and FIG. 7D are schematic views for explaining the mode of operation of the sensor element in FIG. 6.
Figure 7B:
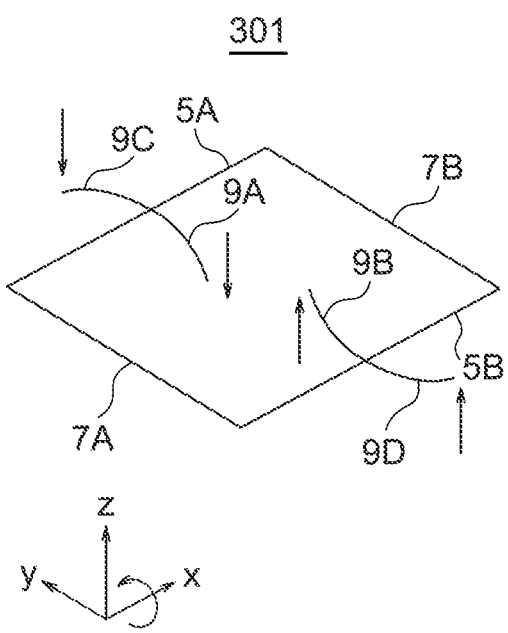

FIG. 7A and FIG. 7B are schematic perspective views for explaining the vibration of the detection arms 9 due to the Coriolis force in the sensor element 301 according to the third embodiment for detecting the rotation around the x-axis. FIG. 7A and FIG. 7B correspond to the state where the phases of excitation are different by 180° from each other (see FIG. 3A and FIG. 3B although the detection arms 9C and 9D are not shown).

When the sensor element 301 is rotated around the x-axis in the state where the piezoelectric body 303 is vibrating by application of voltage, in the same way as the first embodiment, the detection arms 9 vibrate in the z-axis direction due to the Coriolis force. At this time, among the plurality of detection arms 9A to 9D, ones vibrating with phases causing displacements to mutually the same sides in the y-axis direction vibrate so as to bend to mutually the same sides in the z-axis direction, while ones vibrating with phases causing displacements to mutually reverse sides in the y-axis direction vibrate so as to bend to the mutually reverse sides in the z-axis direction.

Specifically, the detection arms 9A and 9C connected together to the frame 5A vibrate so as to bend to mutually the same sides in the z-axis direction. The detection arms 9B and 9D connected together to the frame 5B vibrate so as to bend to mutually the same sides in the z-axis direction. Further, the set of the detection arms 9A and 9C and the set of the detection arms 9B and 9D vibrate so as to bend to mutually reverse sides in the z-axis direction.

In order to add the signals generated in such detection arms 9A to 9D, for example, the detection electrode 17A in the detection arm 9A, the detection electrode 17B in the detection arm 9B, the detection electrode 17A in the detection arm 9C, and the detection electrode 17B in the detection arm 9D are mutually connected. Next, the detection electrode 17B in the detection arm 9A, the detection electrode 17A in the detection arm 9B, the detection electrode 17B in the detection arm 9C, and the detection electrode 17A in the detection arm 9D are mutually connected. These connections are for example made by the plurality of wirings 19. Further, all detection electrodes 17 are connected through the two among the four pads 13 to the detection circuit 105.

Figure 7C:
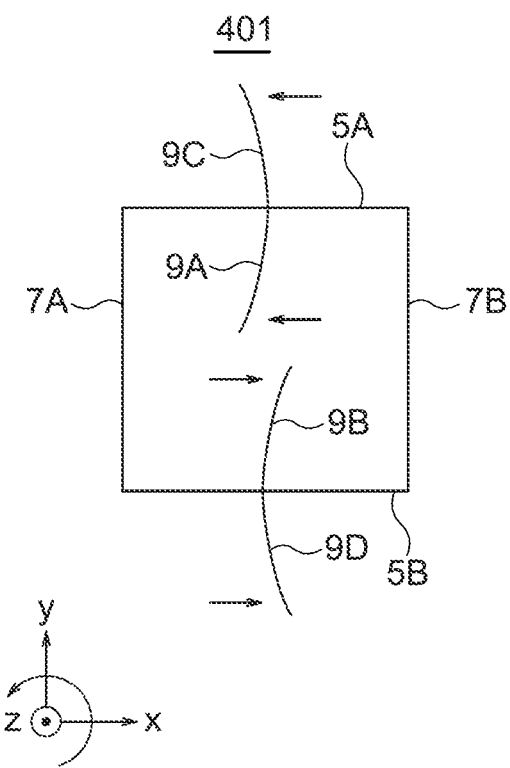
Figure 7D:
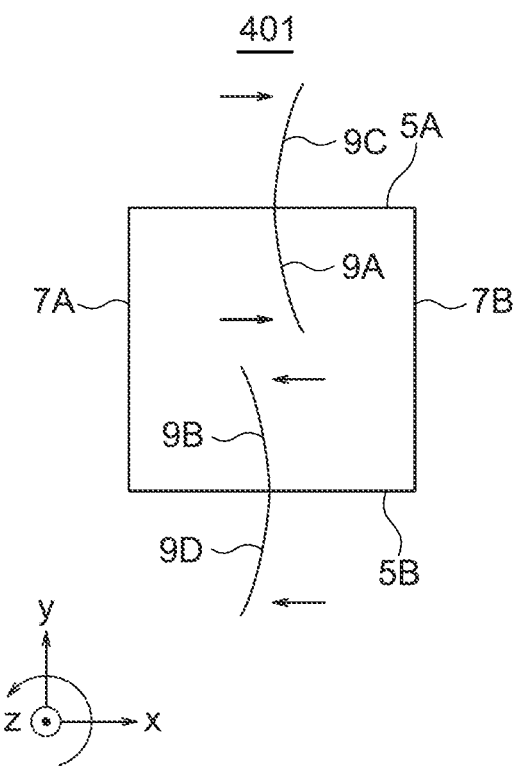

FIG. 7C and FIG. 7D are schematic plan views for explaining vibration of the detection arms 9 due to the Coriolis force in the sensor element 401 according to the fourth embodiment detecting the rotation around the z-axis. FIG. 7C and FIG. 7D correspond to the state where the phases of excitation are different by 180° from each other (see FIG. 3A and FIG. 3B although the detection arms 9C and 9D are not shown).

When the sensor element 401 is rotated around the z-axis in the state where the piezoelectric body 303 is vibrating by application of voltages, in the same way as the second embodiment, the detection arms 9 vibrate in the x-axis direction due to the Coriolis force. At this time, among the plurality of detection arms 9A to 9D, ones vibrating with phases causing displacements to mutually the same sides in the y-axis direction vibrate so as to bend to mutually the same sides in the x-axis direction, while ones vibrating with phases causing displacements to mutually reverse sides in the y-axis direction vibrate so as to bend to the mutually reverse sides in the x-axis direction.

Specifically, the detection arms 9A and 9C connected together to the frame 5A vibrate so as to bend to mutually the same sides in the x-axis direction. The detection arms 9B and 9D connected together to the frame 5B vibrate so as to bend to mutually the same sides in the x-axis direction. Further, the set of the detection arms 9A and 9C and the set of the detection arms 9B and 9D vibrate so as to bend to mutually reverse sides in the x-axis direction.

In order to add the signals generated in such detection arms 9A to 9D, for example, the detection electrode 217A in the detection arm 9A, the detection electrode 217B in the detection arm 9B, the detection electrode 217A in the detection arm 9C, and the detection electrode 217B in the detection arm 9D are mutually connected. Then, the detection electrode 217B in the detection arm 9A, the detection electrode 217A in the detection arm 9B, the detection electrode 217B in the detection arm 9C, and the detection electrode 217A in the detection arm 9D are mutually connected. These connections are for example made by the plurality of wirings 19. Further, all detection electrodes 217 are connected through two among the four pads 13 to the detection circuit 105.

As described above, the angular velocity sensor or sensor element in the third or fourth embodiment includes the angular velocity sensor or sensor element in the first or second embodiment, therefore the same effects as those by the angular velocity sensor or sensor element in the first or second embodiment are exerted. For example, detection according to a new mode of vibration becomes possible.

Further, in the third and fourth embodiments, the piezoelectric body 3 has the pair of detection arms 9A and 9B extending from the pair of frames 5 toward the inner sides of the pair of frames 5 and the pair of detection arms 9C and 9D extending from the pair of frames 5 toward the outer sides of the pair of frames 5. Accordingly, in comparison with the first or second embodiment, the mass of the detection arms 9 upon which the Coriolis force acts becomes two times larger. As a result, for example the detection sensitivity is improved.

Fifth Embodiment

Figure 8A:
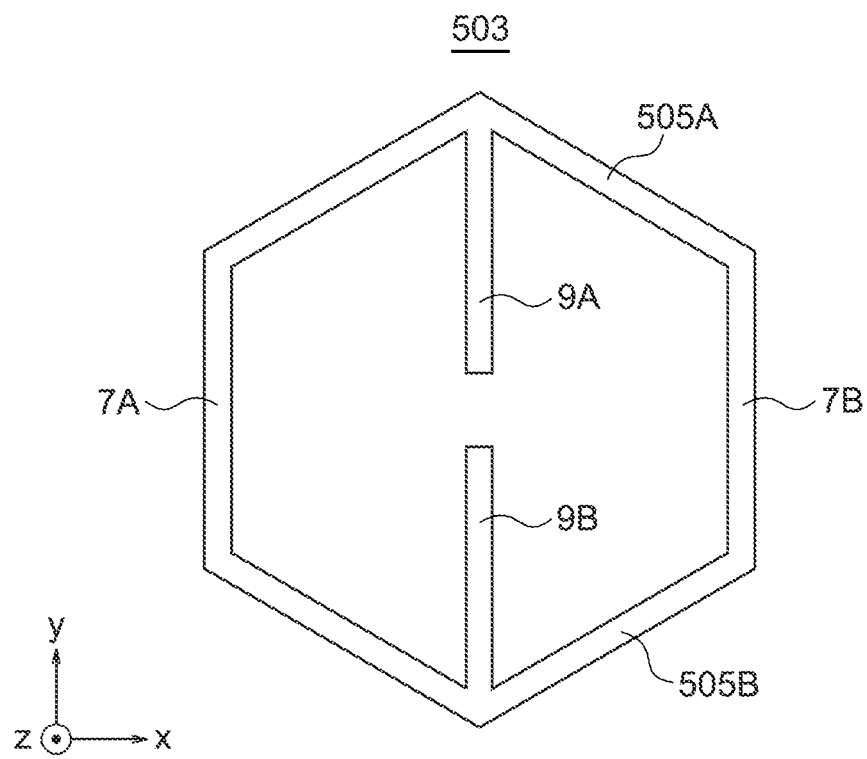
FIG. 8A is a plan view showing a sensor element according to a fifth embodiment.

FIG. 8A is a plan view showing a piezoelectric body 503 of a sensor element according to a fifth embodiment. This sensor element is one detecting the angular velocity around the x-axis or z-axis.

The piezoelectric body 503 is obtained by modifying the shape of the frames in the piezoelectric body 3 in the first or second embodiment. Specifically, each of frames 505A and 505B is configured by two sides which do not extend linearly in the x-axis direction, but are inclined relative to the x-axis. More specifically, for example, each frame 505 is configured by two equal sides of an isosceles triangle having a base (not shown) parallel to the x-axis. Further, for example, the pair of frames 505 and the pair of drive arms 7 configure a regular hexagon. The pair of detection arms 9 are positioned at the apex angles of the isosceles triangles configured by the frames 505.

Even in such a shape, the same mode of vibration as that in the first or second embodiment is realized. Further, for example, the distance between the pair of detection arms 9 can be increased, therefore it is easy to secure the length (mass) of the pair of detection arms 9 and improve the detection sensitivity.

Sixth Embodiment

Figure 8B:
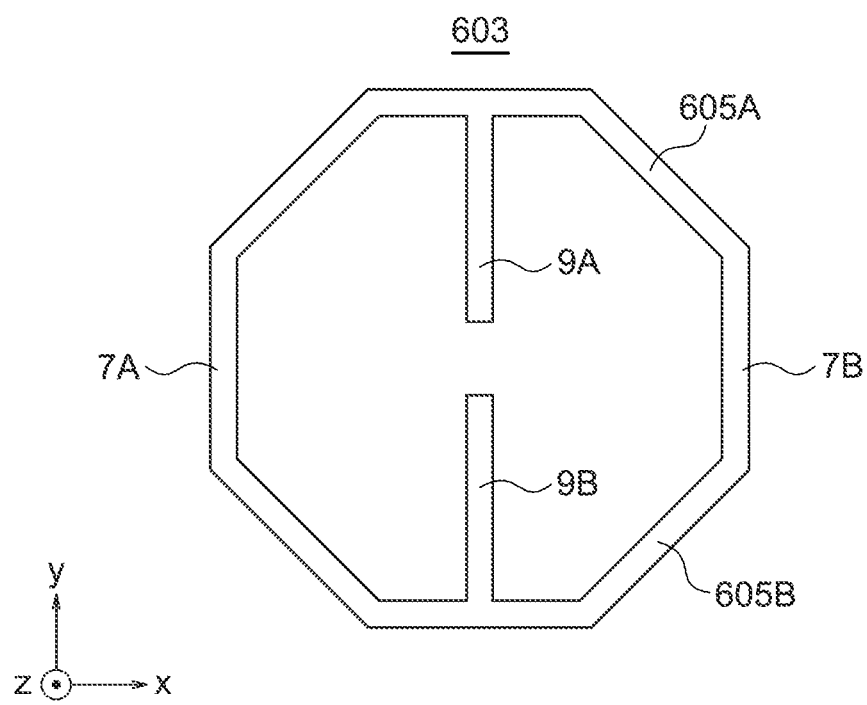
FIG. 8B is a plan view showing a sensor element according to a sixth embodiment.

FIG. 8B is a plan view showing a piezoelectric body 603 of a sensor element according to a sixth embodiment. This sensor element is one detecting the angular velocity around the x-axis or around the z-axis.

The piezoelectric body 603, in the same way as the piezoelectric body 503 in the fifth embodiment, is formed by modification of the shape of the frames in the piezoelectric body 3 in the first or second embodiment. Specifically, for example, each of the frames 605A and 605B is configured by an upper base and two legs of a trapezoid. Further, for example, the pair of frames 605 and the pair of drive arms 7 configure a regular octagon. The pair of detection arms 9 are positioned at the centers of the upper bases configured by the frames 605.

Even in such a shape, the same mode of vibration as that in the first or second embodiment is realized. Further, for example, the distance between the pair of detection arms 9 can be increased, therefore it is easy to secure the length (mass) of the pair of detection arms 9 and improve the detection sensitivity.

Note that, the modifications as in FIG. 5 and FIG. 6 can be applied to the other embodiments other than the first and second embodiments (for example the third or fourth embodiment) as well.

<Multi-Axis Angular Velocity Sensor>
(Overall Configuration)

Figure 9:
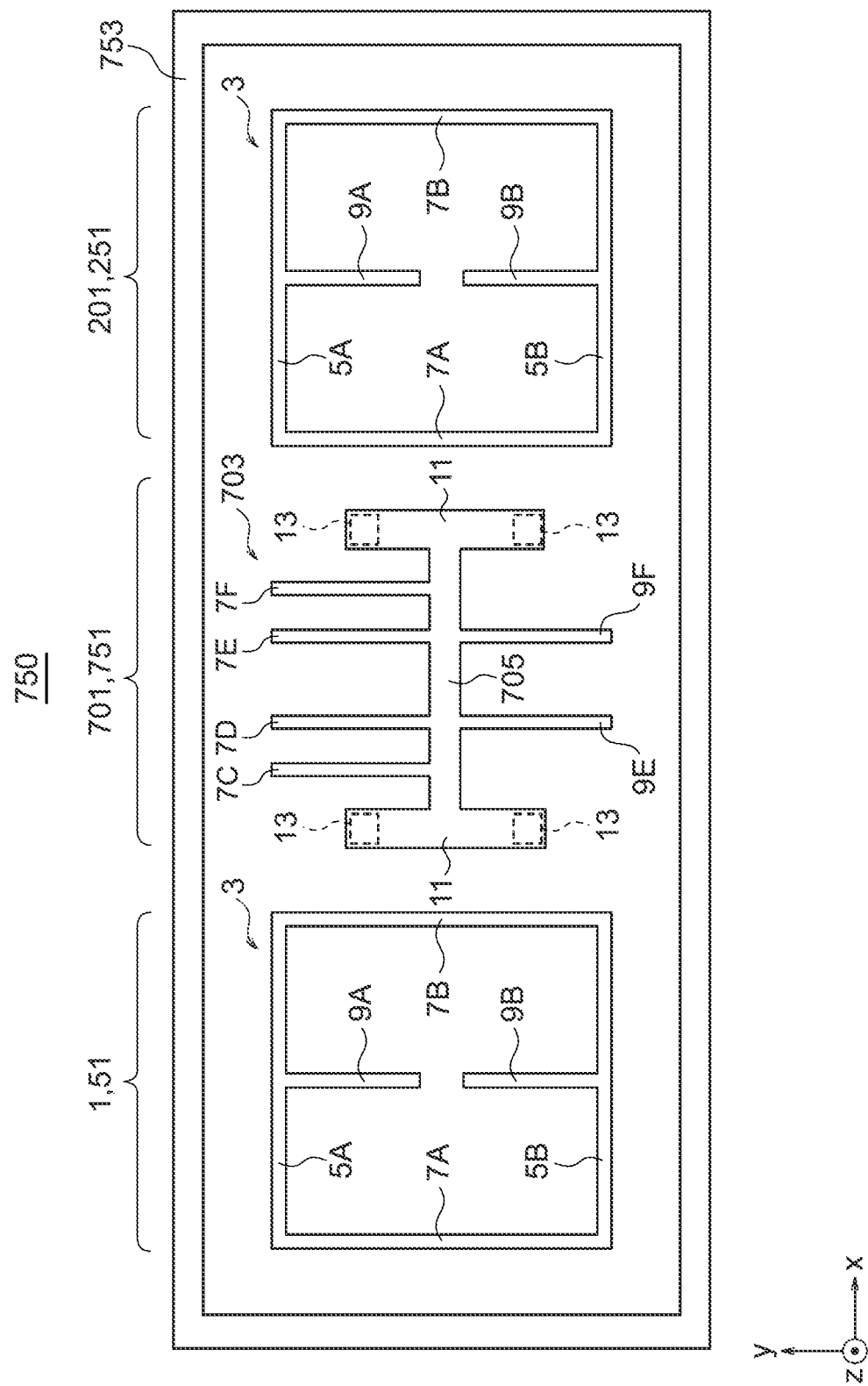
FIG. 9 is a plan view showing the configuration of a multi-axis angular velocity sensor.

FIG. 9 is a plan view showing the configuration of a multi-axis angular velocity sensor 750 including an angular velocity sensor explained above.

The multi-axis angular velocity sensor 750 has an angular velocity sensor 51 detecting the angular velocity around the x-axis (below, sometimes referred to as the "x-axis sensor 51"), a y-axis sensor 751 detecting the angular velocity around the y-axis, and an angular velocity sensor 251 detecting the angular velocity around the z-axis (below, sometimes referred to as the "z-axis sensor 251"). Note that, in the example shown, the angular velocity sensor according to the first embodiment is shown as the x-axis sensor 51, and the angular velocity sensor according to the second embodiment is shown as the z-axis sensor 251. However, the x-axis sensor 51 and the z-axis sensor 251 may be replaced by the angular velocity sensors in the other embodiments explained above as well.

The x-axis sensor 51 has a sensor element 1, a drive circuit 103 (FIG. 2B) applying voltages to the sensor element 1, and a detection circuit 105 (FIG. 2C) detecting the signals from the sensor element 1. The configurations and operations of them are as already explained.

The z-axis sensor 251 has a sensor element 201, a drive circuit 103 (FIG. 4B) applying voltages to the sensor element 201, and a detection circuit 105 (FIG. 4C) detecting the signals from the sensor element 201. The configurations and operations of them are as already explained.

The y-axis sensor 751 has a sensor element 701, a drive circuit 103 (FIG. 2B) applying voltages to the sensor element 701, and a detection circuit 105 (FIG. 2C) detecting the signals from the sensor element 701. The configurations and operations of them are as already explained.

The y-axis sensor 751, in the same way as the x-axis sensor 51 and z-axis sensor 251, is a piezoelectric vibration type one. The sensor element 701 has a piezoelectric body 703. The piezoelectric body 703 has for example a base part 705, one or more drive arms 7 and one or more detection arms 9 which are all supported by the base part 705, and a pair of mounting portions 11 supporting the base part 705.

The sensor element 1, sensor element 701, and sensor element 201 are for example aligned in the x-axis direction. Note that, the order of arrangement of the three sensor elements may be other than the shown order as well. These sensor elements are for example mounted on the same mounting body 753. The mounting body 753 configures for example a package of the multi-axis angular velocity sensor 750 and is configured by providing not shown pads and external terminals on an insulation base body. In the example shown, the mounting body 753 has a concave portion opened on the positive side of the z-axis direction and the sensor elements are accommodated in the concave portion. Further, although not particularly shown, on the mounting body 753, for example an IC including the drive circuit 103 and detection circuit 105 is mounted.

Note that, the drive circuit 103 may be shared by the x-axis sensor 51, y-axis sensor 751, and z-axis sensor 251. From another viewpoint, the frequencies when exciting the piezoelectric bodies of these three angular velocity sensors may be made the same. Further, in a case where the drive circuit 103 is not shared, the frequencies when exciting the piezoelectric bodies of the three angular velocity sensors may be different from each other or may be the same as each other.

(Y-Axis Sensor)

The y-axis sensor 751 may be given various configurations including known configurations. In the following description, one example thereof will be explained.

The piezoelectric body 703 is for example configured linearly symmetrically relative to a not shown symmetrical axis parallel to the y-axis and has four (two pairs of) drive arms 7C, 7D, 7E, and 7F extending from the base part 705 toward one side (positive side in the example shown) of the y-axis direction and two detection arms 9E and 9F extending from the base part 705 toward the side opposite to the drive arms 7.

Figure 10A:
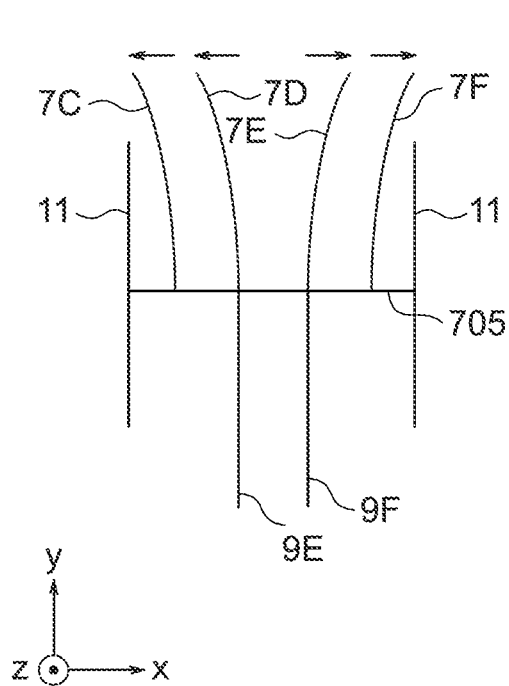
FIG. 10A, FIG. 10B, FIG. 10C, and FIG. 10D are schematic views for explaining the mode of operation of a y-axis sensor included in the multi-axis angular velocity sensor in FIG. 9.
Figure 10B:
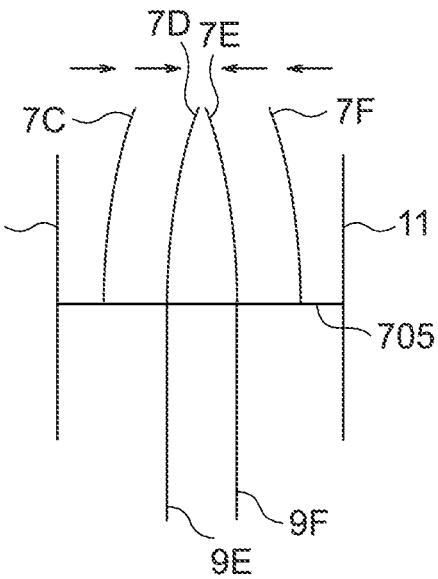

FIG. 10A and FIG. 10B are plan views showing the excitation states of the piezoelectric body 703.

The four drive arms 7C, 7D, 7E, and 7F are for example excited so that the two (7C and 7D, or 7E and 7F) which are positioned on the same side (positive side or negative side) in the x-axis direction relative to the center of the piezoelectric body 703 bend to mutually the same sides in the x-axis direction, and the two positioned on the positive side of the x-axis direction and the two positioned on the negative side of the x-axis direction bend to the mutually reverse sides in the x-axis direction. Note that, by vibration of these drive arms 7, the base part 705 need not bend and the detection arms 9D and 9E need not vibrate.

In order to realize the above operations, in each drive arm 7, the excitation electrodes 15A and 15B are arranged and connected in the same way as those in the drive arm in the first or second embodiment. Further, in the two positioned on the same side (positive side or negative side) of the x-axis direction, the excitation electrodes 15A are mutually connected and the excitation electrodes 15B are mutually connected. Between the two positioned on the positive side of the x-axis direction and the two positioned on the negative side of the x-axis direction, in the same way as the drive arms 7A and 7B in the other embodiments, the excitation electrodes 15A and the excitation electrodes 15B are connected. The connections are made by the plurality of wirings 19. Further, all excitation electrodes 15 are connected through two pads to the drive circuit 103.

Figure 10C:
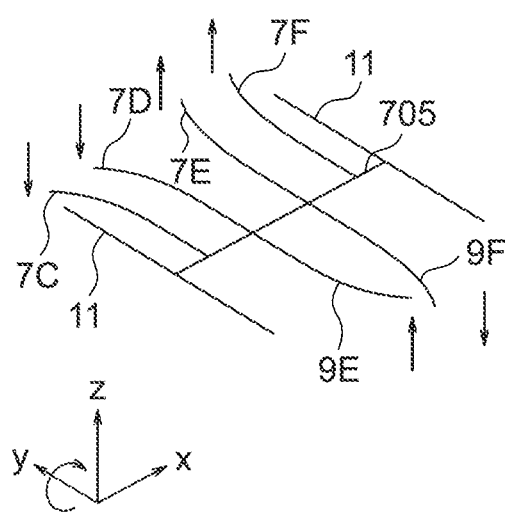
Figure 10D:
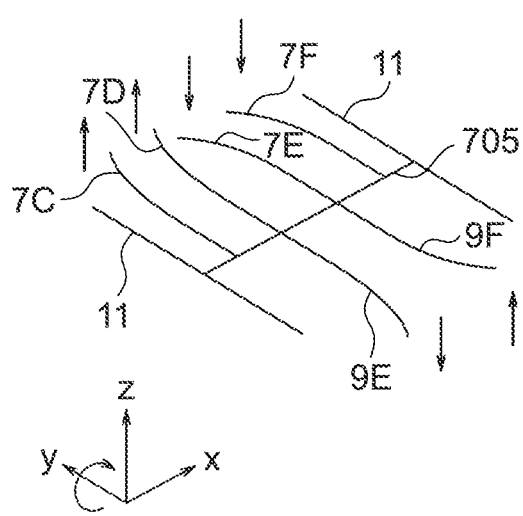

FIG. 10C and FIG. 10D are perspective views showing vibrations due to the Coriolis force in the piezoelectric body 703.

When the piezoelectric body 703 is rotated around the y-axis in the state where the drive arms 7 are vibrated as described above, upon the drive arms 7, the Coriolis force acts in the direction (z-axis direction) perpendicular to the vibration direction (x-axis direction) and to the rotation axis (y-axis). As a result, the drive arms 7 vibrate so as to cause bending deformations in the z-axis direction. The drive arms 7C and 7D positioned on the negative side of the x-axis direction and the drive arms 7E and 7F positioned on the positive side of the x-axis direction are vibrating in mutually reverse directions in the x-axis direction, therefore they vibrate so as to bend to the same side around the rotation axis (around the y-axis). That is, the two vibrate so as to bend to the mutually reverse sides in the z-axis direction.

The vibrations of these drive arms 7 in the z-axis direction are transferred through the base part 705 to the detection arms 9E and 9F. Further, the detection arms 9 vibrate so as to bend to the reverse sides in the z-axis direction to the drive arms 7 positioned on the same sides in the x-axis direction. Further, the two detection arms 9 vibrate so as to bend to the mutually reverse sides in the z-axis direction.

In order to extract the signals generated in such detection arms 9, for example, in each detection arm 9, detection electrodes 17 having arrangements and connections as shown in the first embodiment (FIG. 2A and FIG. 2B) are provided. Further, in order to add the signals of the two detection arms 9 which bend to the mutually reverse sides, between the two detection arms 9, the detection electrode 17A and the detection electrode 17B are connected by the wiring 19. Further, the all detection electrodes 17 are connected through the two pads 13 to the detection circuit 105.

The y-axis sensor may have various configurations other than the configuration described above, for example, one having eight drive arms and two detection arms disclosed in Japanese Patent Publication No. 2015-99130A, a tuning-fork shaped one having one drive arm and one detection arm, and one having a pair of drive arms and pair of detection arms all of which extend toward the same side in the y-axis direction. It may be a sensor which does not have a mounting portion, but is mounted in the base part as well.

Note that, in the above embodiments, all of the detection arms 9A and 9D are single examples of the first detection arms. In the third and fourth embodiments, the detection arms 9A and 9B are single examples of the first detection arms, and the detection arms 9C and 9D are single examples of the second detection arms. The excitation electrode 15A is one example of the first excitation electrode, and the excitation electrode 15B is one example of the second excitation electrode. The detection electrode 17A is one example of the first detection electrode, and the detection electrode 17B is one example of the second detection electrode. The detection electrode 217A is one example of the first detection electrode from another viewpoint, and the detection electrode 217B is one example of the second detection electrode from another viewpoint. The drive arms 7C to 7F are single examples of the y-axis drive arms, and the detection arms 9E and 9F are single examples of the y-axis detection arms. The drive circuit 103 in the y-axis sensor 751 is one example of the y-axis drive circuit, and the detection circuit 105 in the y-axis sensor 751 is one example of the y-axis detection circuit.

In the multi-axis angular velocity sensor 750 as described above, the excitation directions of the drive arms 7 in the x-axis sensor 51, y-axis sensor 751, and z-axis sensor 251 are basically the same. Accordingly, for example, mutual interferences of vibrations between two or three sensors do not become complex, and reduction of noise is facilitated. Further, for example, piezoelectric bodies for these three types of sensors can be formed from the same piezoelectric wafer and the like.

The present invention is not limited to the above embodiments and may be executed in various ways.

The drive arms and detection arms need not be parallel to the y-axis either so far as they extend in the y-axis direction. The piezoelectric body may be one having only a pair of detection arms (9C and 9D) extending toward the outer sides of the pair of frames as the detection arms as well. In this case, for example, the possibility of the drive arms and the detection arms abutting in the x-axis direction is reduced. Further, in a case where the piezoelectric body has only one pair of detection arms as the detection arms, one of the pair of detection arms may extend toward the inner side of the pair of frames, while the other of the pair of detection arms may extend toward the outer side of the frame (for example the piezoelectric body may have only the detection arms 9A and 9D as well). Further, two or more detection arms may extend alongside each other from one frame (on the same side in the y-axis direction) as well. Two or more pairs of drive arms may be provided as well.

The sensor element or angular velocity sensor may be configured as a portion of an MEMS (micro electromechanical system). In this case, a piezoelectric body configuring a sensor element may be mounted on the substrate of the MEMS, or the substrate of the MEMS may be configured by a piezoelectric body and the piezoelectric body of the sensor element may be configured by a portion thereof.

The multi-axis angular velocity sensor may be one having only two among the x-axis sensor, y-axis sensor, and z-axis sensor as well. In the embodiments, the piezoelectric bodies of the three angular velocity sensors were aligned in the x-axis direction, but may be aligned in the y-axis direction or be aligned in an L-shape as well.

REFERENCE SIGNS LIST

1 . . . sensor element, 3 . . . piezoelectric body, 5 . . . frame, 7 . . . drive arm (first drive arm), 9 . . . detection arm, 103 . . . drive circuit, and 105 . . . detection circuit.

The invention claimed is:
1. An angular velocity sensor comprising:
a piezoelectric body comprising
a pair of frames facing each other in a y-axis direction in an orthogonal coordinate system xyz,
a pair of drive arms which are respectively laid bridging the pair of frames and face each other in an x-axis direction, and
a pair of first detection arms extending from the pair of frames in the y-axis direction at positions which are between the pair of drive arms in the x-axis direction;
a drive circuit which applies voltages of mutually reverse phases to the pair of drive arms so that the pair of drive arms bend to mutually reverse sides in the x-axis direction and vibrate; and
a detection circuit which detects signals generated due to bending deformations of the pair of first detection arms in a z-axis direction or the x-axis direction, wherein the pair of frames bend in the y-axis direction by the pair of driving arms bending in the x-axis direction.

2. The angular velocity sensor according to claim 1, wherein the detection circuit detects the signals generated due to bending deformations in the z-axis direction of the pair of first detection arms.

3. The angular velocity sensor according to claim 1, wherein the detection circuit detects the signals generated due to the bending deformations in the x-axis direction of the pair of detection arms.

4. The angular velocity sensor according to claim 1, wherein the pair of first detection arms extend toward the inner sides of the pair of frames.

5. The angular velocity sensor according to claim 4, wherein the piezoelectric body further comprises a pair of second detection arms extending from the pair of frames toward the outer sides of the pair of frames at positions between the pair of drive arms in the x-axis direction.

6. The angular velocity sensor according to claim 2, further comprising:
   a pair of first excitation electrodes which are located on a pair of first surfaces facing the two sides of the z-axis direction in each of the pair of drive arms,
   a pair of second excitation electrodes which are located on a pair of second surfaces facing the two sides of the x-axis direction in each of the pair of drive arms,
   a pair of first detection electrodes for each of the pair of first detection arms, each of the pair of first detection arms comprising a third surface facing the negative side of the x-axis direction and a fourth surface facing the positive side of the x-axis direction, the pair of first detection electrodes being individually located on the third surface so as to be closer to the positive side of the z-axis direction than the center of the third surface and located on the fourth surface so as to be closer to the negative side of the z-axis direction than the center of the fourth surface,
   a pair of second detection electrodes for each of the pair of first detection arms, which are individually located on the third surface so as to be closer to the negative side of the z-axis direction than the center of the third surface and located on the fourth surface so as to be closer to the positive side of the z-axis direction than the center of the fourth surface, and
   a plurality of wirings mutually connecting the pair of first excitation electrodes in each of the pair of drive arms, mutually connecting the pair of second excitation electrodes in each of the pair of drive arms, connecting the pair of first excitation electrodes and the pair of second excitation electrodes between the pair of drive arms, mutually connecting the pair of first detection electrodes in each of the pair of first detection arms, and mutually connecting the pair of second detection electrodes in each of the pair of first detection arms, wherein
   the drive circuit applies voltages through the plurality of wirings to the pair of first excitation electrodes and the pair of second excitation electrodes in each of the pair of the drive arms, and
   the detection circuit detects the voltages between the pair of first detection electrodes and the pair of second detection electrodes through the plurality of wirings.

7. The angular velocity sensor according to claim 3, further comprising:
   a pair of first excitation electrodes which are located on a pair of first surfaces facing the two sides of the z-axis direction in each of the pair of drive arms,
   a pair of second excitation electrodes which are located on a pair of second surfaces facing the two sides of the x-axis direction in each of the pair of drive arms,
   a pair of first detection electrodes which, in each of the pair of first detection arms, are located on a pair of third surfaces facing the two sides of the z-axis direction,
   a pair of second detection electrodes which, in each of the pair of first detection arms, are located on a pair of fourth surfaces facing the two sides of the x-axis direction, and
   a plurality of wirings mutually connecting the pair of first excitation electrodes in each of the pair of drive arms, mutually connecting the pair of second excitation electrodes in each of the pair of drive arms, connecting the pair of first excitation electrodes and the pair of second excitation electrodes between the pair of drive arms, mutually connecting the pair of first detection electrodes in each of the pair of first detection arms, and mutually connecting the pair of second detection electrodes in each of the pair of first detection arms, wherein
   the drive circuit applies voltages through the plurality of wirings to the pair of first excitation electrodes and the pair of second excitation electrodes in each of the pair of the drive arms, and
   the detection circuit detects the voltages between the pair of first detection electrodes and the pair of second detection electrodes through the plurality of wirings.

8. A multi-axis angular velocity sensor comprising:
   an x-axis sensor detecting an angular velocity around the x-axis in an orthogonal coordinate system xyz;
   a y-axis sensor detecting an angular velocity around a y-axis; and
   a z-axis sensor detecting an angular velocity around a z-axis, wherein
   the x-axis sensor is the angular velocity sensor according to claim 2,
   the y-axis sensor comprises
      a piezoelectric body comprising a y-axis drive arm and a y-axis detection arm each extending in the y-axis direction,
      a y-axis drive circuit applying voltages to the y-axis drive arm so that the y-axis drive arm vibrates in the x-axis direction, and
      a y-axis detection circuit detecting signals generated due to bending deformation in the z-axis of the detection arm, and
   the z-axis sensor comprises
   a piezoelectric body comprising
   a pair of z-axis frames facing each other in the y-axis direction,
   a pair of z-axis drive arms which are respectively laid bridging the pair of z-axis frames and face each other in an x-axis direction, and
   a pair of z-axis detection arms extending from the pair of z-axis frames in the y-axis direction at positions which are between the pair of z-axis drive arms in the x-axis direction;
   a z-axis drive circuit which applies voltages of mutually reverse phases to the pair of z-axis drive arms so that the pair of z-axis drive arms bend to mutually reverse sides in the x-axis direction and vibrate, and
   a z-axis detection circuit which detects signals generated due to bending deformations of the pair of z-axis detection arms in the x-axis direction, wherein the pair of z-axis frames bend in the y-axis direction by the pair of z-axis drive arms bending in the x-axis direction.

9. A sensor element comprising:
a piezoelectric body comprising
- a pair of frames facing each other in a y-axis direction in an orthogonal coordinate system xyz,
- a pair of drive arms which are respectively laid bridging the pair of frames and face each other in the x-axis direction, and
- a pair of first detection arms extending from the pair of frames in the y-axis direction at positions between the pair of drive arms in the x-axis direction;

a plurality of excitation electrodes located in an arrangement capable of applying voltages exciting the pair of drive arms in the x-axis direction;

a plurality of detection electrodes located in an arrangement capable of detecting signals generated due to vibration in the z-axis direction or x-axis direction of the pair of first detection arms; and a plurality of wirings connecting the plurality of excitation electrodes so that voltages of mutually reverse phases are applied from the plurality of excitation electrodes to the pair of drive arms so that the pair of drive arms bend to mutually reverse sides in the x-axis direction and vibrate, wherein the pair of frames bend in the y-axis direction by the pair of driving arms bending in the x-axis direction.

* * * * *